(12) United States Patent
Takeda et al.

(10) Patent No.: US 10,233,337 B2
(45) Date of Patent: Mar. 19, 2019

(54) CHARGE-TRANSPORTING VARNISH

(71) Applicant: NISSAN CHEMICAL INDUSTRIES, LTD., Tokyo (JP)

(72) Inventors: Kayo Takeda, Funabashi (JP); Takuji Yoshimoto, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/382,261

(22) PCT Filed: Feb. 22, 2013

(86) PCT No.: PCT/JP2013/054508
§ 371 (c)(1),
(2) Date: Aug. 29, 2014

(87) PCT Pub. No.: WO2013/129249
PCT Pub. Date: Sep. 6, 2013

(65) Prior Publication Data
US 2015/0053892 A1 Feb. 26, 2015

(30) Foreign Application Priority Data

Mar. 2, 2012 (JP) .................. 2012-046502

(51) Int. Cl.
*C09D 5/24* (2006.01)
*H01L 51/00* (2006.01)
*C09D 179/02* (2006.01)
*C08G 73/02* (2006.01)
*C09D 4/00* (2006.01)
*C09D 7/20* (2018.01)
*H01L 51/50* (2006.01)

(52) U.S. Cl.
CPC ........... *C09D 5/24* (2013.01); *C08G 73/0266* (2013.01); *C09D 4/00* (2013.01); *C09D 7/20* (2018.01); *C09D 179/02* (2013.01); *H01L 51/0007* (2013.01); *H01L 51/0059* (2013.01); *H01L 51/5056* (2013.01); *H01L 51/5088* (2013.01)

(58) Field of Classification Search
CPC .......... C09D 5/00; C09D 5/05; C09D 179/02; C08G 61/12
USPC ................... 252/500; 428/441.1; 429/483
See application file for complete search history.

(56) References Cited

U.S. PATENT DOCUMENTS

| | | | |
|---|---|---|---|
| 7,771,842 B2 | 8/2010 | Yoshimoto et al. | |
| 7,862,747 B2 | 1/2011 | Yoshimoto et al. | |
| 8,298,444 B2 | 10/2012 | Yamada et al. | |
| 8,357,770 B2 | 1/2013 | Yoshimoto et al. | |
| 2006/0115652 A1 | 6/2006 | Yoshimoto et al. | |
| 2007/0173578 A1 | 7/2007 | Spreitzer et al. | |
| 2007/0205400 A1 | 9/2007 | Kato et al. | |
| 2008/0265214 A1 | 10/2008 | Steiger et al. | |
| 2009/0239045 A1 | 9/2009 | Kato et al. | |
| 2010/0159279 A1 | 6/2010 | Kato et al. | |
| 2011/0033774 A1* | 2/2011 | Yamashita | C08G 61/12 429/483 |
| 2011/0195355 A1 | 8/2011 | Nakaie et al. | |

FOREIGN PATENT DOCUMENTS

| | | | |
|---|---|---|---|
| CN | 1922744 A | 2/2007 | |
| JP | 2003-317749 | * 11/2003 | .............. H01M 8/02 |
| JP | 2008-273896 A | 11/2008 | |
| JP | 2010-123930 A | 6/2010 | |
| WO | WO 2004/043117 A1 | 5/2004 | |
| WO | WO 2005/000832 A1 | 1/2005 | |
| WO | WO 2005/107335 A1 | 11/2005 | |
| WO | WO 2007/049631 A1 | 11/2005 | |
| WO | WO 2006/025342 A1 | 3/2006 | |
| WO | WO 2008/032616 A1 | 3/2008 | |
| WO | WO 2008/032617 A1 | 3/2008 | |
| WO | WO 2008/129947 A1 | 10/2008 | |
| WO | WO 2009/096352 A1 | 6/2009 | |
| WO | WO 2010/041701 A1 | 4/2010 | |
| WO | WO 2010/058777 A1 | 5/2010 | |

OTHER PUBLICATIONS

Extended European Search Report dated Sep. 7, 2015, in European Patent Application No. 13755851.6.
International Search Report issued in PCT/JP2013/054508, dated May 23, 2013.
Ochi et al., "Preparation of Linear Oligoaniline Derivatives Using Titanium Alkoxide as a Condensing Agent", Bulletin of Chemical Society of Japan, Jun. 1994, pp. 1749-1752, vol. 67.
Written Opinion of the International Searching Authority issued in PCT/JP2013/054508, dated May 23, 2013.

(Continued)

*Primary Examiner* — Khanh T Nguyen

(74) *Attorney, Agent, or Firm* — Birch, Stewart, Kolasch & Birch, LLP

(57) ABSTRACT

A charge-transporting thin film having excellent flatness can be obtained with good repeatability using the charge-transporting varnish of the present invention, which contains: a charge transportation substance comprising a charge-transporting monomer or a charge-transporting oligomer or polymer having a number-average molecular weight of 200-50,000, or a charge transporting material comprising the charge transportation substance and a dopant substance; and a mixed solvent including at least one type of good solvent and at least one type of poor solvent; the absolute value of the boiling point difference $\Delta T°$ C. of the good solvent and the poor solvent satisfying the relation $|\Delta T|<20°$ C.; the viscosity at 25° C. being 7.5 mPa·s or less; the surface tension at 23° C. being 30.0-40.0 mN/m; and the charge-transporting material being dissolved or uniformly dispersed in the mixed solvent.

8 Claims, No Drawings

(56) References Cited

OTHER PUBLICATIONS

Zhang et al., "Synthesis of Oligomeric Anilines", Synthetic Metals, 1997, pp. 119-120, vol. 84.
Taiwanese Office Action for Application No. 10521397410, dated Nov. 14, 2016.

* cited by examiner

CHARGE-TRANSPORTING VARNISH

TECHNICAL FIELD

The present invention relates to a charge-transporting varnish. More specifically, the invention relates to a charge-transporting varnish which is capable of forming thin-films having a good flatness.

BACKGROUND ART

Charge-transporting thin-films which contain a charge-transporting oligomer or polymer are commonly used as the charge injection layer, charge transport layer or emissive layer in organic electroluminescence devices (abbreviated below as "organic EL devices").

These charge-transporting thin-films are required to have a high flatness. This is because surface irregularity of the charge-transporting thin-film leads to, for example, uneven light emission by the device, a shortened device life, dark spot formation, and lowering of the device characteristics due to electrical shorting, and is thought to bring about a decline in yield during the production of organic EL devices.

Accordingly, there exists a strong desire for a technology that is industrially feasible and is capable of forming charge-transporting thin-films of high flatness.

Charge-transporting thin-film forming processes are broadly divided into dry processes such as vacuum deposition and wet processes such as spin coating.

Comparing dry processes and wet processes, the latter processes are capable of easily producing thin-films having a high flatness and thus can be expected to improve the device yield.

For reasons such as this, it is wet processes that are predominantly used in the industrial fabrication of organic EL devices.

In light of the above, the inventors have developed charge-transporting varnishes for producing, by wet processes, charge-transporting thin-films applicable to various types of electronic devices (see, for example, Patent Documents 1 to 3).

However, given the advances being made in the area of electronic displays, such as the trend in recent years toward larger devices for displaying graphics, there has been a growing need for charge-transporting varnishes which are capable of very precise and reproducible film formation over a large surface area. Existing varnishes have not always been able to fully satisfy such a need.

CITATION LIST

Patent Documents

Patent Document 1: WO 2004/043117
Patent Document 2: WO 2005/107335
Patent Document 3: WO 2007/049631

SUMMARY OF THE INVENTION

Problems to be Solved by the Invention

It is therefore an object of the present invention to provide a charge-transporting varnish which is able to provide, with good reproducibility, charge-transporting thin-films of excellent flatness.

Means for Solving the Problems

The inventors have conducted extensive investigations, as a result of which they have discovered that thin-films of a higher uniformity and minimal surface irregularity can be reproducibly formed using a varnish in which both a good solvent and a poor solvent for a charge-transporting substance or charge-transporting material are used as solvents for varnish preparation, the good and poor solvents having a boiling point difference therebetween that has been suitably adjusted, and which varnish has a viscosity and surface tension that have been adjusted within suitable ranges.

Accordingly, the invention provides:

1. A charge-transporting varnish characterized by including a charge-transporting substance made of a charge-transporting monomer or a charge-transporting oligomer or polymer having a number-average molecular weight of from 200 to 500,000, or a charge-transporting material made of the charge-transporting substance and a dopant substance; and a mixed solvent containing, in combination, at least one good solvent and at least one poor solvent, wherein the good solvent and the poor solvent have a boiling point difference $\Delta T$ (° C.) therebetween with an absolute value that satisfies the condition $|\Delta T|<20°$ C., the varnish has a viscosity at 25° C. of 7.5 mPa·s or less and a surface tension at 23° C. of from 30.0 to 40.0 mN/m, and the charge-transporting material is dissolved or uniformly dispersed in the mixed solvent;

2. The charge-transporting varnish according to 1 above, wherein the good solvent is at least one selected from among N-methylformamide, N,N-dimethylformamide, N,N-diethylformamide, N-methylacetamide, N,N-dimethylacetamide, N-methylpropionamide, N-methylpyrrolidone, 1,3-dimethyl-2-imidazolidinone, trimethyl phosphate, triethyl phosphate, diethylene glycol and triethylene glycol;

3. The charge-transporting varnish according to 1 or 2 above, wherein the poor solvent is at least one selected from among ethylene glycol, propylene glycol, dipropylene glycol, hexylene glycol, 1,2-butanediol, 2,3-butanediol, 1,3-butanediol, 1,4-butanediol, 1,5-pentanediol, octylene glycol, glycerol, ethylene glycol monomethyl ether, ethylene glycol monomethyl ether acetate, ethylene glycol monoethyl ether, ethylene glycol diethyl ether, ethylene glycol isopropyl ether, ethylene glycol monobutyl ether, ethylene glycol dibutyl ether, ethylene glycol monobutyl ether acetate, ethylene glycol benzyl ether, ethylene glycol monohexyl ether, 2-methoxyethanol, ethylene glycol monoacetate, ethylene glycol monoisobutyl ether, ethylene glycol monoethyl ether acetate, ethylene glycol diacetate, diethylene glycol monomethyl ether acetate, diethylene glycol monoethyl ether, diethylene glycol monoethyl ether acetate, diethylene glycol monobutyl ether, diethylene glycol monobutyl ether acetate, diethylene glycol dimethyl ether, diethylene glycol methyl ethyl ether, diethylene glycol diethyl ether, diethylene glycol dibutyl ether, diethylene glycol monophenyl ether, triethylene glycol monomethyl ether, triethylene glycol monoethyl ether, triethylene glycol dimethyl ether, tetraethylene glycol, polyethylene glycol, propylene glycol monomethyl ether, propylene glycol monoethyl ether, propylene glycol monopropyl ether, propylene glycol monobutyl ether, propylene glycol monophenyl ether, propylene glycol monomethyl ether acetate, 1-butoxyethoxypropanol, dipropylene glycol monomethyl ether, dipropylene glycol monoethyl ether, dipropylene glycol monopropyl ether, dipropylene glycol monobutyl ether, tripropylene glycol monomethyl ether, trimethylene glycol, methanol, ethanol, 1-propanol, 2-propanol, 1-butanol, 2-butanol, 1-pentanol, 1-hexanol, 1-heptanol, 1-nonanol, 1-decanol, 1-undecanol, 1-dodecanol, 1-tetradecanol, benzyl alcohol, cyclohexanol, 2-methylcyclohexanol, glycidol, furfuryl alcohol, tetrahydrofurfuryl alcohol, diacetone alcohol, 2-ethylhexanol, 2-phenoxyethanol, α-terpineol, ethyl ether, isopropyl ether, di-n-butyl ether, di-n-hexyl ether, anisole, ethyl phenyl ether, n-butyl phenyl ether, benzyl isoamyl ether, o-cresyl methyl ether, m-cresyl methyl ether, p-cresyl methyl ether, ethyl benzyl ether, diglycidyl ether, 1,4-dioxane, trioxane, furfural, 2-methylfuran, tetrahydrofuran, tetrahydropyran, cineol, methylal, diethylacetal, propyl formate, n-butyl formate, isobutyl formate, methyl acetate, ethyl acetate, n-propyl acetate, isopropyl acetate, n-butyl acetate, isobutyl acetate, sec-butyl acetate, n-amyl acetate, isoamyl acetate, methyl isoamyl acetate, n-hexyl acetate, sec-hexyl acetate, 2-ethylbutyl acetate, 2-ethylhexyl acetate, cyclohexyl acetate, methylcyclohexyl acetate, benzyl acetate, methyl propionate, ethyl propionate, n-butyl propionate, isoamyl propionate, methyl butyrate, ethyl butyrate, n-butyl butyrate, isoamyl butyrate, ethyl oxyisobutyrate, butyl stearate, amyl stearate, methyl acetobutyrate, ethyl acetobutyrate, isoamyl isovalerate, methyl lactate, ethyl lactate, n-butyl lactate, isobutyl lactate, n-amyl lactate, isoamyl lactate, methyl benzoate, ethyl benzoate, propyl benzoate, butyl benzoate, isoamyl benzoate, benzyl benzoate, methyl salicylate, diethyl oxalate, dibutyl oxalate, diamyl oxalate, diethyl malonate, tributyl citrate, dioctyl sebacate, dimethyl phthalate, diethyl phthalate, di-n-butyl phthalate, di-2-ethylhexyl phthalate, di-n-octyl phthalate, methyl ethyl ketone, methyl n-propyl ketone, methyl n-butyl ketone, methyl isobutyl ketone, methyl n-amyl ketone, methyl n-hexyl ketone, diethyl ketone, ethyl n-butyl ketone, di-n-propyl ketone, diisobutyl ketone, 2,6,8-trimethylnonan-4-one, acetonylacetone, mesityl oxide, phorone, isophorone, cyclohexanone, methylcyclohexanone, acetophenone, 2-ethylhexanoic acid, oleic acid, lactic acid, phenol, o-cresol, m-cresol, p-cresol, xylenol, heptane, octane, 2,2,3-trimethylhexane, decane, dodecane, toluene, xylene, o-xylene, m-xylene, p-xylene, cumene, mesitylene, tetralin, p-cymene, cyclohexylbenzene, diethylbenzene, pentylbenzene, dipentylbenzene, dodecylbenzene, cyclohexane, methylcyclohexane, ethylcyclohexane, p-menthane, bicyclohexene, a-pinene and dipentene;

4. The charge-transporting varnish according to any of 1 to 3 above, wherein the combination of the good solvent and the poor solvent is N,N-dimethylacetamide and 2,3-butanediol, N,N-dimethylacetamide and cyclohexanol, N,N-dimethylacetamide and diethylene glycol dimethyl ether, N,N-dimethylacetamide and n-hexylacetate, N,N-dimethylacetamide and ethylene glycol monoethyl ether acetate, 1,3-dimethyl-2-imidazolidinone and diethylene glycol monobutyl ether, 1,3-dimethyl-2-imidazolidinone and diethylene glycol monoethyl ether acetate, 1,3-dimethyl-2-imidazolidinone and triethylene glycol dimethyl ether, 1,3-dimethyl-2-imidazolidinone and 2-phenoxyethanol, 1,3-dimethyl-2-imidazolidinone and 1,3-butanediol, 1,3-dimethyl-2-imidazolidinone and tripropylene glycol monomethyl ether, 1,3-dimethyl-2-imidazolidinone and ethylene glycol monohexyl ether, N-methylpyrrolidone and diethylene glycol diethyl ether, N-methylpyrrolidone and diethylene glycol monoethyl ether acetate, N-methylpyrrolidone and triethylene glycol dimethyl ether, N-methylpyrrolidone and 1,3-butanediol, N-methylpyrrolidone and ethylene glycol monohexyl ether, N-methylpyrrolidone and diethylene glycol monoethyl ether, N,N-dimethylacetamide and 2,3-butanediol and ethylene glycol monoethyl ether acetate, N,N-dimethylacetamide and 2,3-butanediol and cyclohexanol, N,N-dimethylacetamide and 2,3-butanediol and diethylene glycol dimethyl ether, N,N-dimethylacetamide and 2,3-butanediol and n-hexylacetate, N,N-dimethylacetamide and cyclohexanol and diethylene glycol dimethyl ether, N,N-dimethylacetamide and cyclohexanol and n-hexylacetate, N,N-dimethylacetamide and cyclohexanol and ethylene glycol monoethyl ether acetate, N,N-dimethylacetamide and diethylene glycol dimethyl ether and n-hexylacetate, N,N-dimethylacetamide and diethylene glycol dimethyl ether and ethylene glycol monoethyl ether acetate, N,N-dimethylacetamide and n-hexylacetate and ethylene glycol monoethyl ether acetate, 1,3-dimethyl-2-imidazolidinone and diethylene glycol monoethyl ether acetate and 2-phenoxyethanol, 1,3-dimethyl-2-imidazolidinone and diethylene glycol monobutyl ether and diethylene glycol monoethyl ether acetate, 1,3-dimethyl-2-imidazolidinone and diethylene glycol monobutyl ether and triethylene glycol dimethyl ether, 1,3-dimethyl-2-imidazolidinone and diethylene glycol monobutyl ether and 2-phenoxyethanol, 1,3-dimethyl-2-imidazolidinone and diethylene glycol monobutyl ether and 1,3-butanediol, 1,3-dimethyl-2-imidazolidinone and diethylene glycol monobutyl ether and tripropylene glycol monomethyl ether, 1,3-dimethyl-2-imidazolidinone and diethylene glycol monobutyl ether and ethylene glycol monohexyl ether, 1,3-dimethyl-2-imidazolidinone and diethylene glycol monoethyl ether acetate and triethylene glycol dimethyl ether, 1,3-dimethyl-2-imidazolidinone and diethylene glycol monoethyl ether acetate and 1,3-butanediol, 1,3-dimethyl-2-imidazolidinone and diethylene glycol monoethyl ether acetate and tripropylene glycol monomethyl ether, 1,3-dimethyl-2-imidazolidinone and diethylene glycol monoethyl ether acetate and ethylene glycol monohexyl ether, 1,3-dimethyl-2-imidazolidinone and triethylene glycol dimethyl ether and 2-phenoxyethanol, 1,3-dimethyl-2-imidazolidinone and triethylene glycol dimethyl ether and 1,3-butanediol, 1,3-dimethyl-2-imidazolidinone and triethylene glycol dimethyl ether and tripropylene glycol monomethyl ether, 1,3-dimethyl-2-imidazolidinone and triethylene glycol dimethyl ether and ethylene glycol monohexyl ether, 1,3-dimethyl-2-imidazolidinone and 2-phenoxyethanol and 1,3-butanediol, 1,3-dimethyl-2-imidazolidinone and 2-phenoxyethanol and tripropylene glycol monomethyl ether, 1,3-dimethyl-2-imidazolidinone and 2-phenoxyethanol and ethylene glycol monohexyl ether, 1,3-dimethyl-2-imidazolidinone and 1,3-butanediol and tripropylene glycol monomethyl ether, 1,3-dimethyl-2-imidazolidinone and 1,3-butanediol and ethylene glycol monohexyl ether, 1,3-dimethyl-2-imidazolidinone and tripropylene glycol monomethyl ether and ethylene glycol monohexyl ether, N-methylpyrrolidone and diethylene glycol monoethyl ether acetate and diethylene glycol diethyl ether, N-methylpyrrolidone and diethylene glycol monoethyl ether acetate and triethylene glycol dimethyl ether, N-methylpyrrolidone and diethylene glycol monoethyl ether acetate and 1,3-butanediol, N-methylpyrrolidone and diethylene glycol monoethyl ether acetate and ethylene glycol monohexyl ether, N-methylpyrrolidone and diethylene glycol monoethyl ether acetate and diethylene glycol monoethyl ether, N-methylpyrrolidone and diethylene glycol diethyl ether and triethylene glycol dimethyl ether, N-methylpyrrolidone and diethylene glycol diethyl ether and 1,3-butanediol, N-methylpyrrolidone and diethylene glycol diethyl ether and ethylene glycol monohexyl ether, N-methylpyrrolidone and diethylene glycol diethyl ether and diethylene glycol monoethyl ether, N-methylpyrrolidone and triethylene glycol dimethyl ether and 1,3-butanediol, N-methylpyrrolidone and triethylene glycol dimethyl ether and ethylene glycol monohexyl ether, N-methylpyrrolidone and triethylene glycol dimethyl ether and diethylene glycol monoethyl ether, N-methylpyrrolidone and 1,3-butanediol and ethylene glycol monohexyl ether, N-methylpyrrolidone and 1,3-butanediol and diethylene glycol monoethyl ether, or N-methylpyrrolidone and ethylene glycol monohexyl ether and diethylene glycol monoethyl ether;

5. The charge-transporting varnish according to any of 1 to 4 above, wherein the charge-transporting substance is an oligoaniline derivative of formula (1) or a quinonediimine derivative which is an oxidized form of formula (1)

[Chemical Formula 1]

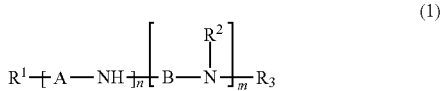

(1)

(wherein $R^1$, $R^2$ and $R^3$ are each independently a hydrogen atom, a halogen atom, a hydroxyl group, an amino group, a silanol group, a thiol group, a carboxyl group, a phosphate group, a phosphate ester group, an ester group, a thioester group, an amido group, a nitro group, a monovalent hydrocarbon group, an organooxy group, an organoamino group, an organosilyl group, an organothio group, an acyl group or a sulfonic acid group; A and B are each independently a divalent group of formula (2) or (3) below

[Chemical Formula 2]

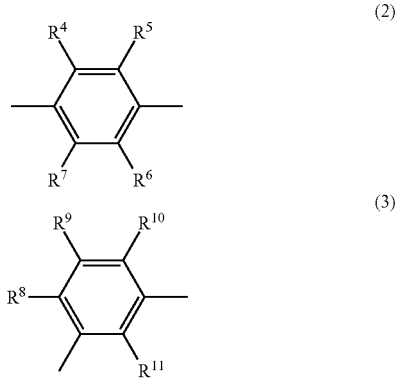

(2)

(3)

($R^4$ to $R^{11}$ being each independently a hydrogen atom, a halogen atom, a hydroxyl group, an amino group, a silanol group, a thiol group, a carboxyl group, a phosphate group, a phosphate ester group, an ester group, a thioester group, an amido group, a nitro group, a monovalent hydrocarbon group, an organooxy group, an organoamino group, an organosilyl group, an organothio group, an acyl group or a sulfonic acid group); and m and n are each independently an integer of 1 or more, and together satisfy the condition m+n≤20);

6. The charge-transporting varnish according to any of 1 to 5 above which is adapted for use in slit coating;

7. A charge-transporting thin-film produced from the charge-transporting varnish according to any of 1 to 5 above;

8. An organic electroluminescence device having the charge-transporting thin-film of 7 above;

9. The organic electroluminescence device according to 8 above, wherein the charge-transporting thin-film is a hole injection layer or a hole transport layer;

10. A method of producing a charge-transporting thin-film using the charge-transporting varnish according to any of 1 to 5 above; and 11. A method of enhancing the flatness of a charge-transporting thin-film produced using a charge-transporting varnish that includes a charge-transporting substance made of a charge-transporting monomer or a charge-transporting oligomer or polymer having a number-average molecular weight of from 200 to 500,000, or a charge-transporting material made of the charge-transporting substance and a charge-accepting dopant substance; and a solvent, which method is characterized by using as the solvent a mixed solvent containing at least one good solvent and at least one bad solvent, and setting the boiling point difference ΔT (° C.) between the good solvent and the poor solvent to an absolute value that satisfies the condition |ΔT|<20° C., setting the viscosity at 25° C. of the charge-transporting varnish to 7.5 mPa·s or less, and setting the surface tension at 23° C. of the charge-transporting varnish to from 30.0 to 40.0 mN/m.

Advantageous Effects of the Invention

Using the charge-transporting varnish of the invention, it is possible to produce charge-transporting thin-films of excellent flatness at a good reproducibility. This enables organic EL devices and the like to be stably fabricated in a high yield.

Moreover, using this charge-transporting varnish, it is possible to obtain thin-films of excellent uniformity compared with conventional charge-transporting thin-films. As a result, electrical shorting triggered by foreign matter that has formed in the thin-film can be minimized, current concentration, defects and the like in the organic EL devices are reduced, and an improved reliability can be achieved.

In addition, the charge-transporting varnish of the invention, even when formed into a film by a slit-coating process which is capable of film formation over a large surface area, provides a charge-transporting thin-film in which the film thickness has been controlled to a high precision, and thus can fully accommodate advances in the fields of electronic displays and lighting, such as the trend in recent years toward larger devices for displaying graphics.

EMBODIMENT FOR CARRYING OUT THE INVENTION

The invention is described more fully below.

The charge-transporting varnish according to this invention includes both a charge-transporting substance made of a charge-transporting monomer or a charge-transporting oligomer or polymer having a number-average molecular weight of from 200 to 500,000, or a charge-transporting material made of the charge-transporting substance and a dopant substance, and also a mixed solvent containing at least one good solvent and at least one poor solvent. The good solvent and the poor solvent have a boiling point difference ΔT (° C.) therebetween with an absolute value that satisfies the condition |ΔT|<20° C. The varnish has a viscosity at 25° C. of 7.5 mPa·s or less, and has a surface tension at 23° C. of from 30.0 to 40.0 mN/m. The charge-transporting material is dissolved or uniformly dispersed in the mixed solvent.

As used herein, "charge-transporting" is synonymous with electrically conductive, and refers to any of the following: hole-transporting, electron-transporting, and both hole- and electron-transporting. The charge-transporting varnish of the invention itself may have charge transportability, or the solid film obtained using the varnish may have charge transportability.

In this invention, the boiling points of the solvents and the boiling point difference are values at $1.01 \times 10^5$ Pa (atmospheric pressure).

In the charge-transporting varnish of the invention, a good solvent having an excellent ability to dissolve the charge-transporting substance or charge-transporting material and a poor solvent lacking the ability to dissolve the charge-transporting substance or charge-transporting material are used in combination, and it is critical for the absolute value of the boiling point difference $\Delta T$ (° C.) therebetween to satisfy the condition $|\Delta T| < 20°$ C.

In a solvent composition having a boiling point difference outside of this range, the uniformity and flatness of the resulting thin-film decrease. To obtain a thin-film having a better uniformity and flatness, the absolute value of $\Delta T$ (° C.) is preferably such that $|\Delta T| \leq 19°$ C., and more preferably such that $|\Delta T| \leq 18°$ C.

Illustrative examples of the good solvent include N-methylformamide, N,N-dimethylformamide, N,N-diethylformamide, N-methylacetamide, N,N-dimethylacetamide, N-methylpropionamide, N-methylpyrrolidone, 1,3-dimethyl-2-imidazolidinone, trimethyl phosphate, triethyl phosphate, dimethylsulfoxide, N-cyclohexyl-2-pyrrolidinone, diethylene glycol and triethylene glycol. These may each be used singly or may be used in combinations of two or more thereof.

Of these, N,N-dimethylacetamide (166.1° C.), N-methylpyrrolidone (202.0° C.) and 1,3-dimethyl-2-imidazolidinone (225.0° C.) are preferred (here and below, the values within parentheses are boiling points).

Illustrative examples of the poor solvent include ethylene glycol, propylene glycol, dipropylene glycol, hexylene glycol, 1,2-butanediol, 2,3-butanediol, 1,3-butanediol, 1,4-butanediol, 1,5-pentanediol, octylene glycol, glycerol, ethylene glycol monomethyl ether, ethylene glycol monomethyl ether acetate, ethylene glycol monoethyl ether, ethylene glycol diethyl ether, ethylene glycol isopropyl ether, ethylene glycol monobutyl ether, ethylene glycol dibutyl ether, ethylene glycol monobutyl ether acetate, ethylene glycol benzyl ether, ethylene glycol monohexyl ether, 2-methoxyethanol, ethylene glycol monoacetate, ethylene glycol monoisobutyl ether, ethylene glycol monoethyl ether acetate, ethylene glycol diacetate, diethylene glycol monomethyl ether acetate, diethylene glycol monoethyl ether, diethylene glycol monoethyl ether acetate, diethylene glycol monobutyl ether, diethylene glycol monobutyl ether acetate, diethylene glycol dimethyl ether, diethylene glycol methyl ethyl ether, diethylene glycol diethyl ether, diethylene glycol dibutyl ether, diethylene glycol monophenyl ether, triethylene glycol monomethyl ether, triethylene glycol monoethyl ether, triethylene glycol dimethyl ether, tetraethylene glycol, polyethylene glycol, propylene glycol monomethyl ether, propylene glycol monoethyl ether, propylene glycol monopropyl ether, propylene glycol monobutyl ether, propylene glycol monophenyl ether, propylene glycol monomethyl ether acetate, 1-butoxyethoxypropanol, dipropylene glycol monomethyl ether, dipropylene glycol monoethyl ether, dipropylene glycol monopropyl ether, dipropylene glycol monobutyl ether, tripropylene glycol monomethyl ether, trimethylene glycol, methanol, ethanol, 1-propanol, 2-propanol, 1-butanol, 2-butanol, 1-pentanol, 1-hexanol, 1-heptanol, 1-nonanol, 1-decanol, 1-undecanol, 1-dodecanol, 1-tetradecanol, benzyl alcohol, cyclohexanol, 2-methylcyclohexanol, diacetone alcohol, 2-ethylhexanol, 2-phenoxyethanol, α-terpineol, ethyl ether, isopropyl ether, di-n-butyl ether, di-n-hexyl ether, anisole, ethyl phenyl ether, n-butyl phenyl ether, benzyl isoamyl ether, o-cresyl methyl ether, m-cresyl methyl ether, p-cresyl methyl ether, ethyl benzyl ether, diglycidyl ether, 1,4-dioxane, trioxane, furfural, 2-methylfuran, tetrahydrofuran, tetrahydropyran, cineol, methylal, diethylacetal, propyl formate, n-butyl formate, isobutyl formate, methyl acetate, ethyl acetate, n-propyl acetate, isopropyl acetate, n-butyl acetate, isobutyl acetate, sec-butyl acetate, n-amyl acetate, isoamyl acetate, methyl isoamyl acetate, n-hexyl acetate, sec-hexyl acetate, 2-ethylbutyl acetate, 2-ethylhexyl acetate, cyclohexyl acetate, methylcyclohexyl acetate, benzyl acetate, methyl propionate, ethyl propionate, n-butyl propionate, isoamyl propionate, methyl butyrate, ethyl butyrate, n-butyl butyrate, isoamyl butyrate, ethyl oxyisobutyrate, butyl stearate, amyl stearate, methyl acetobutyrate, ethyl acetobutyrate, isoamyl isovalerate, methyl lactate, ethyl lactate, n-butyl lactate, isobutyl lactate, n-amyl lactate, isoamyl lactate, methyl benzoate, ethyl benzoate, propyl benzoate, butyl benzoate, isoamyl benzoate, benzyl benzoate, methyl salicylate, diethyl oxalate, dibutyl oxalate, diamyl oxalate, diethyl malonate, tributyl citrate, dioctyl sebacate, dimethyl phthalate, diethyl phthalate, di-n-butyl phthalate, di-2-ethylhexyl phthalate, di-n-octyl phthalate, methyl ethyl ketone, methyl n-propyl ketone, methyl n-butyl ketone, methyl isobutyl ketone, methyl n-amyl ketone, methyl n-hexyl ketone, diethyl ketone, ethyl n-butyl ketone, di-n-propyl ketone, diisobutyl ketone, 2,6,8-trimethylnonan-4-one, acetonylacetone, mesityl oxide, phorone, isophorone, cyclohexanone, methylcyclohexanone, acetophenone, 2-ethylhexanoic acid, oleic acid, lactic acid, phenol, o-cresol, m-cresol, p-cresol, xylenol, heptane, octane, 2,2,3-trimethylhexane, decane, dodecane, toluene, xylene, o-xylene, m-xylene, p-xylene, cumene, mesitylene, tetralin, p-cymene, cyclohexylbenzene, diethylbenzene, pentylbenzene, dipentylbenzene, dodecylbenzene, cyclohexane, methylcyclohexane, ethylcyclohexane, p-menthane, bicyclohexene, α-pinene and dipentene.

Of these, 2,3-butanediol (182.0° C.), cyclohexanol (161.1° C.), diethylene glycol monobutyl ether (230.4° C.), diethylene glycol monoethyl ether acetate (217.4° C.), diethylene glycol dimethyl ether (159.6° C.), n-hexyl acetate (169.2° C.), diethylene glycol diethyl ether (188.4° C.), ethylene glycol monoethyl ether acetate (156.8° C.), triethylene glycol dimethyl ether (216.0° C.), 2-phenoxyethanol (237.0° C.), 1,3-butanediol (207.4° C.), triethylene glycol monomethyl ether (249.0° C.), triethylene glycol monoethyl ether (255.9° C.), diethylene glycol monobutyl ether acetate (246.8° C.), tripropylene glycol monomethyl ether (243.0° C.), ethylene glycol monohexyl ether (208.1° C.), diethylene glycol monoethyl ether (195.0° C.) and propylene glycol monomethyl ether (120.0° C.) are preferred. 2,3-Butanediol (132.0° C.), cyclohexanol (161.1° C.), diethylene glycol monobutyl ether (230.4° C.), diethylene glycol monoethyl ether acetate (217.4° C.), diethylene glycol dimethyl ether (159.6° C.), n-hexyl acetate (169.2° C.), diethylene glycol diethyl ether (188.4° C.), ethylene glycol monoethyl ether acetate (156.8° C.), triethylene glycol dimethyl ether (216.0° C.), 2-phenoxyethanol (237.0° C.), 1,3-butanediol (207.4° C.), tripropylene glycol monomethyl ether (243.0° C.) and ethylene glycol monohexyl ether (208.1° C.) are more preferred.

Suitable combinations of the good solvent and the poor solvent include N,N-dimethylacetamide and 2,3-butanediol, N,N-dimethylacetamide and cyclohexanol, N,N-dimethylacetamide and diethylene glycol dimethyl ether, N,N-dimethylacetamide and n-hexylacetate, N,N-dimethylacetamide and ethylene glycol monoethyl ether acetate, 1,3-dimethyl- 2-imidazolidinone and diethylene glycol monobutyl ether, 1,3-dimethyl-2-imidazolidinone and diethylene glycol monoethyl ether acetate, 1,3-dimethyl-2-imidazolidinone and triethylene glycol dimethyl ether, 1,3-dimethyl-2-imidazolidinone and 2-phenoxyethanol, 1,3-dimethyl-2-imidazolidinone and 1,3-butanediol, 1,3-dimethyl-2-imidazolidinone and tripropylene glycol monomethyl ether, 1,3-dimethyl-2-imidazolidinone and ethylene glycol monohexyl ether, N-methylpyrrolidone and diethylene glycol diethyl ether, N-methylpyrrolidone and diethylene glycol monoethyl ether acetate, N-methylpyrrolidone and triethylene glycol dimethyl ether, N-methylpyrrolidone and 1,3-butanediol, N-methylpyrrolidone and ethylene glycol monohexyl ether, N-methylpyrrolidone and diethylene glycol monoethyl ether, N,N-dimethylacetamide and 2,3-butanediol and ethylene glycol monoethyl ether acetate, N,N-dimethylacetamide and 2,3-butanediol and cyclohexanol, N,N-dimethylacetamide and 2,3-butanediol and diethylene glycol dimethyl ether, N,N-dimethylacetamide and 2,3-butanediol and n-hexylacetate, N,N-dimethylacetamide and cyclohexanol and diethylene glycol dimethyl ether, N,N-dimethylacetamide and cyclohexanol and n-hexylacetate, N,N-dimethylacetamide and cyclohexanol and ethylene glycol monoethyl ether acetate, N,N-dimethylacetamide and diethylene glycol dimethyl ether and n-hexylacetate, N,N-dimethylacetamide and diethylene glycol dimethyl ether and ethylene glycol monoethyl ether acetate, N,N-dimethyl acetamide and n-hexylacetate and ethylene glycol monoethyl ether acetate, 1,3-dimethyl-2-imidazolidinone and diethylene glycol monoethyl ether acetate and 2-phenoxyethanol, 1,3-dimethyl-2-imidazolidinone and diethylene glycol monobutyl ether and diethylene glycol monoethyl ether acetate, 1,3-dimethyl-2-imidazolidinone and diethylene glycol monobutyl ether and triethylene glycol dimethyl ether, 1,3-dimethyl-2-imidazolidinone and diethylene glycol monobutyl ether and 2-phenoxyethanol, 1,3-dimethyl-2-imidazolidinone and diethylene glycol monobutyl ether and 1,3-butanediol, 1,3-dimethyl-2-imidazolidinone and diethylene glycol monobutyl ether and tripropylene glycol monomethyl ether, 1,3-dimethyl-2-imidazolidinone and diethylene glycol monobutyl ether and ethylene glycol monohexyl ether, 1,3-dimethyl-2-imidazolidinone and diethylene glycol monoethyl ether acetate and triethylene glycol dimethyl ether, 1,3-dimethyl-2-imidazolidinone and diethylene glycol monoethyl ether acetate and 1,3-butanediol, 1,3-dimethyl-2-imidazolidinone and diethylene glycol monoethyl ether acetate and tripropylene glycol monomethyl ether, 1,3-dimethyl-2-imidazolidinone and diethylene glycol monoethyl ether acetate and ethylene glycol monohexyl ether, 1,3-dimethyl-2-imidazolidinone and triethylene glycol dimethyl ether and 2-phenoxyethanol, 1,3-dimethyl-2-imidazolidinone and triethylene glycol dimethyl ether and 1,3-butanediol, 1,3-dimethyl-2-imidazolidinone and triethylene glycol dimethyl ether and tripropylene glycol monomethyl ether, 1,3-dimethyl-2-imidazolidinone and triethylene glycol dimethyl ether and ethylene glycol monohexyl ether, 1,3-dimethyl-2-imidazolidinone and 2-phenoxyethanol and 1,3-butanediol, 1,3-dimethyl-2-imidazolidinone and 2-phenoxyethanol and tripropylene glycol monomethyl ether, 1,3-dimethyl-2-imidazolidinone and 2-phenoxyethanol and ethylene glycol monohexyl ether, 1,3-dimethyl-2-imidazolidinone and 1,3-butanediol and tripropylene glycol monomethyl ether, 1,3-dimethyl-2-imidazolidinone and 1,3-butanediol and ethylene glycol monohexyl ether, 1,3-dimethyl-2-imidazolidinone and tripropylene glycol monomethyl ether and ethylene glycol monohexyl ether, N-methylpyrrolidone and diethylene glycol monoethyl ether acetate and diethylene glycol diethyl ether, N-methylpyrrolidone and diethylene glycol monoethyl ether acetate and triethylene glycol dimethyl ether, N-methylpyrrolidone and diethylene glycol monoethyl ether acetate and 1,3-butanediol, N-methylpyrrolidone and diethylene glycol monoethyl ether acetate and ethylene glycol monohexyl ether, N-methylpyrrolidone and diethylene glycol monoethyl ether acetate and diethylene glycol monoethyl ether, N-methylpyrrolidone and diethylene glycol diethyl ether and triethylene glycol dimethyl ether, N-methylpyrrolidone and diethylene glycol diethyl ether and 1,3-butanediol, N-methylpyrrolidone and diethylene glycol diethyl ether and ethylene glycol monohexyl ether, N-methylpyrrolidone and diethylene glycol diethyl ether and diethylene glycol monoethyl ether, N-methylpyrrolidone and triethylene glycol dimethyl ether and 1,3-butanediol, N-methylpyrrolidone and triethylene glycol dimethyl ether and ethylene glycol monohexyl ether, N-methylpyrrolidone and triethylene glycol dimethyl ether and diethylene glycol monoethyl ether, N-methylpyrrolidone and 1,3-butanediol and ethylene glycol monohexyl ether, N-methylpyrrolidone and 1,3-butanediol and diethylene glycol monoethyl ether, and N-methylpyrrolidone and ethylene glycol monohexyl ether and diethylene glycol monoethyl ether.

Of these, N,N-dimethylacetamide and 2,3-butanediol, N,N-dimethylacetamide and cyclohexanol, N,N-dimethylacetamide and diethylene glycol dimethyl ether, N,N-dimethylacetamide and n-hexylacetate, N,N-dimethylacetamide and ethylene glycol monoethyl ether acetate, 1,3-dimethyl-2-imidazolidinone and diethylene glycol monobutyl ether, 1,3-dimethyl-2-imidazolidinone and diethylene glycol monoethyl ether acetate, 1,3-dimethyl-2-imidazolidinone and triethylene glycol dimethyl ether, 1,3-dimethyl-2-imidazolidinone and 2-phenoxyethanol, 1,3-dimethyl-2-imidazolidinone and 1,3-butanediol, 1,3-dimethyl-2-imidazolidinone and tripropylene glycol monomethyl ether, 1,3-dimethyl-2-imidazolidinone and ethylene glycol monohexyl ether, N-methylpyrrolidone and diethylene glycol diethyl ether, N,N-dimethyl acetamide and 2,3-butanediol and ethylene glycol monoethyl ether acetate, and 1,3-dimethyl-2-imidazolidinone and diethylene glycol monoethyl ether acetate and 2-phenoxyethanol are especially preferred.

In cases where two or more of either the good solvent or the poor solvent or two or more each of the good solvent and the bad solvent are used, it is essential for the absolute value of the boiling point difference ΔT (° C.) when the two solvents for which the boiling point difference between the good solvent and the poor solvent is largest have been selected to satisfy the above-indicated range.

The charge-transporting substance used in this invention is not subject to any particular limitation, provided it is can dissolve in the good solvent and is a charge-transporting monomer or a charge-transporting oligomer or polymer that can dissolve or disperse in the mixed solvent used in the varnish. However, charge-transporting monomers having a conjugating unit, and charge-transporting oligomers having a number-average molecular weight of from 200 to 5,000 and in which conjugating units of a single type are consecutively arranged or in which a combination of two or more differing conjugating units are consecutively arranged in any order are preferred.

Here, the term "conjugating unit" is not particularly limited, provided it refers to, for example, an atom, aromatic ring, conjugated group or the like which is capable of transporting a charge. However, taking into account such considerations as the solubility in organic solvents and the appearance of a good charge transportability, it is preferable to use, for example, any of the following which are substituted or unsubstituted and which are divalent to tetravalent: aniline, thiophene, dithion, furan, pyrrole, ethynylene, vinylene, phenylene, naphthalene, anthracene, imidazole, oxazole, oxadiazole, quinoline, quinoxaline, silole, silicone, pyridine, pyrimidine, pyrazine, phenylenevinylene, fluorene, carbazole, triarylamines, metal or nonmetal phthalocyanines, and metal or nonmetal porphyrins.

The conjugated chain formed by coupling of the conjugating units may include a moiety that is cyclic. Also, "unsubstituted" here means that a hydrogen atom is bonded.

Illustrative examples of substituents on the conjugating units include halogen atoms, hydroxyl groups, amino groups, silanol groups, thiol groups, carboxyl groups, phosphate groups, phosphate ester groups, ester groups, thioester groups, amido groups, nitro groups, monovalent hydrocarbon groups, organooxy groups, organoamino groups, organosilyl groups, organothio groups, acyl groups and sulfonic acid groups.

Illustrative examples of monovalent hydrocarbon groups include alkyl groups such as methyl, ethyl, propyl, butyl, t-butyl, hexyl, octyl and decyl; cycloalkyl groups such as cyclopentyl and cyclohexyl; bicycloalkyl groups such as bicyclohexyl; alkenyl groups such as vinyl, 1-propenyl, 2-propenyl, isopropenyl, 1-methyl-2-propenyl, 1, 2 or 3-butenyl and hexenyl; alkynyl groups such as ethynyl, 1-propynyl, 2-propynyl, 2-butynyl, 3-butynyl, 2-pentynyl, 3-pentynyl, 4-pentynyl, 2-hexynyl and 3-hexynyl; aryl groups such as phenyl, xylyl, tolyl, biphenyl and naphthyl; aralkyl groups such as benzyl, phenylethyl and phenylcyclohexyl; and groups obtained by substituting some or all of the hydrogen atoms on these monovalent hydrocarbon groups with halogen atoms, hydroxyl groups, alkoxy groups and the like.

Illustrative examples of organooxy groups include alkoxy, alkenyloxy and aryloxy groups. The alkyl groups, alkenyl groups and aryl groups on these groups are exemplified by the same groups as mentioned above.

Illustrative examples of organoamino groups include alkylamino groups such as methylamino, ethylamino, propylamino, butylamino, pentylamino, hexylamino, heptylamino, octylamino, nonylamino, decylamino and laurylamino; dialkylamino groups such as dimethylamino, diethylamino, dipropylamino, dibutylamino, dipentylamino, dihexylamino, diheptylamino, dioctylamino, dinonylamino and didecylamino; and also cyclohexylamino and morpholino.

Illustrative examples of organosilyl groups include trimethylsilyl, triethylsilyl, tripropylsilyl, tributylsilyl, tripentylsilyl, trihexylsilyl, pentyldimethylsilyl, hexyldimethylsilyl, octyldimethylsilyl and decyldimethylsilyl.

Illustrative examples of organothio groups include alkylthio groups such as methylthio, ethylthio, propylthio, butylthio, pentylthio, hexylthio, heptylthio, octylthio, nonylthio, decylthio and laurylthio.

Illustrative examples of acyl groups include formyl, acetyl, propionyl, butyryl, isobutyryl, valeryl, isovaleryl and benzoyl.

The number of carbons on the monovalent hydrocarbon group, organooxy group, organoamino group, organosilyl group, organothio group and acyl group, although not particularly limited, is preferably from 1 to 20, and more preferably from 1 to 8.

Of these, fluorine atoms, sulfonic acid groups, substituted or unsubstituted organooxy groups, alkyl groups and organosilyl groups are preferred. However, from the standpoint of eliciting a good charge transportability, it is preferable for the conjugating units to have no substituents thereon (for hydrogen atoms to be bonded thereon).

In this invention, the number-average molecular weight of the charge-transporting substance made of a charge-transporting oligomer or polymer is from 200 to 500,000. At a number-average molecular weight below 200, there is a large possibility that the volatility will be too high and charge transportability will not be fully manifested. On the other hand, at a number-average molecular weight greater than 500,000, there is a large possibility that the solubility in a solvent will be too low, making the charge-transporting substance unsuitable for use.

In particular, from the standpoint of increasing the solubility of the charge-transporting substance in solvent, the number-average molecular weight is preferably not more than 5,000, more preferably not more than 2,000, and even more preferably not more than 1,000.

In addition, to make the solubility or charge transportability of the charge-transporting substance uniform, an oligomer or polymer having no molecular weight distribution (i.e., a polydispersity of 1) is preferred.

The number-average molecular weight is a measured value obtained by gel permeation chromatography (against a polystyrene standard).

It is preferable to use in particular an oligoaniline derivative of formula (1), or a quinonediimine derivative which is an oxidized form thereof, as the charge-transporting substance because these exhibit high solubilities and high charge transportabilities and moreover have suitable ionization potentials.

[Chemical Formula 3]

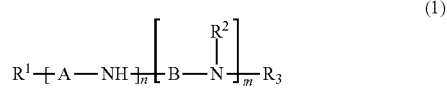

(1)

In formula (1), $R^1$, $R^2$ and $R^3$ are each independently a hydrogen atom, a halogen atom, a hydroxyl group, an amino group, a silanol group, a thiol group, a carboxyl group, a phosphate group, a phosphate ester group, an ester group, a thioester group, an amido group, a nitro group, a monovalent hydrocarbon group, an organooxy group, an organoamino group, an organosilyl group, an organothio group, an acyl group or a sulfonic acid group; A and B are each independently a divalent group of formula (2) or (3) below; and m and n are each independently an integer of 1 or more, and together satisfy the condition m+n≤20.

[Chemical Formula 4]

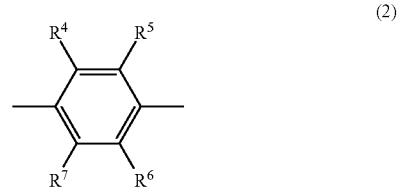

(2)

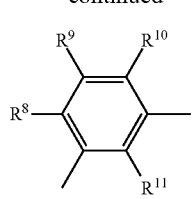
(3)

In formulas (2) and (3), $R^4$ to $R^{11}$ are each independently a hydrogen atom, a halogen atom, a hydroxyl group, an amino group, a silanol group, a thiol group, a carboxyl group, a phosphate group, a phosphate ester group, an ester group, a thioester group, an amido group, a nitro group, a monovalent hydrocarbon group, an organooxy group, an organoamino group, an organosilyl group, an organothio group, an acyl group or a sulfonic acid group.

Illustrative examples of $R^1$ to $R^{11}$ include the same substituents as were mentioned above as substituents on the conjugating units. These substituents may additionally be substituted with any other substituents.

Also, from the standpoint of manifesting a good charge-transportability, m+n is preferably 4 or more. From the standpoint of manifesting a good solubility in the solvent, m+n is preferably 16 or less, and more preferably 10 or less.

Illustrative examples of such compounds include oligoaniline derivatives which are soluble in organic solvents, such as phenyltetraaniline, phenylpentaaniline, tetraaniline (4 aniline monomers), octaaniline (8 aniline monomers), hexadecaaniline (16 aniline monomers), (phenyltrianilino)triphenylamine, (phenyltrianilino)diphenyloctylamine, hexadeca-o-phenetidine (16 o-phenetidine monomers), aminotetraaniline, phenyltetraanilinesulfonic acid (number of sulfonic acid groups, 1 to 4) and (butylphenyl)tetraaniline.

These oligoaniline derivatives may be prepared by the methods described in, for example, *Bulletin of Chemical Society of Japan* (67, 1749-1752 (1994)), *Synthetic Metals* (84, 119-120 (1997)), WO 2008/032617, WO 2008/032616 and WO 2008/129947.

The above quinonediimine structure refers to a structure having one less double bond within the carbon ring of the aromatic compound and having instead two C=N double bonds at the para or ortho positions. For example, in the case of an aryldiamine compound having two amino groups at mutually para positions, the quinonediimine structure becomes a structure like that shown in formula (4).

[Chemical Formula 5]

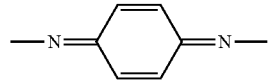
(4)

Examples of preferred charge-transporting substances include, but are not limited to, those of formulas (5) and (6).

[Chemical Formula 6]

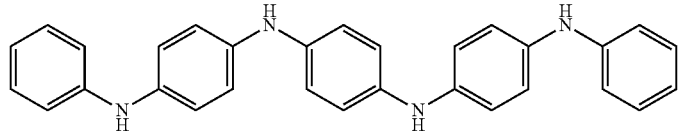
(5)

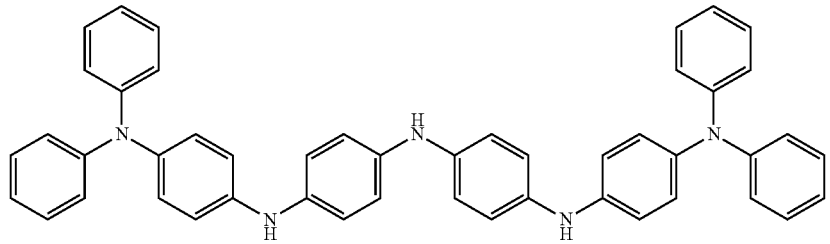
(6)

A charge-accepting dopant substance may be optionally used to enhance, for example, the charge-transportability of the charge-transporting varnish of the invention. Specifically, an electron-accepting dopant substance may be used for a hole-transporting substance, and a hole-accepting dopant substance may be used for an electron-transporting substance.

The solubility of the charge-accepting dopant substance is not particularly limited, provided it dissolves in at least one solvent used in the varnish; either an inorganic electron-accepting substance or an organic electron-accepting substance may be used.

Illustrative examples of inorganic electron-accepting substances include inorganic acids such as hydrogen chloride, sulfuric acid, nitric acid and phosphoric acid; metal halides such as aluminum(III) chloride ($AlCl_3$), titanium(IV) tetrachloride ($TiCl_4$), boron tribromide ($BBr_3$), boron trifluoride-ether complex ($BF_3 \cdot OEt_2$), iron(III) chloride ($FeCl_3$), copper (II) chloride ($CuCl_2$), antimony(V) pentachloride ($SbCl_5$), antimony (V) pentafluoride ($SbF_5$), arsenic (V) pentafluoride ($AsF_5$), phosphorus pentafluoride (PTO and tris(4-bromophenyl)aluminum hexachloroantimonate (TBPAH); halogens such as $Cl_2$, $Br_2$, $I_2$, ICl, $ICl_3$, IBr and $IF_4$; and heteropolyacids such as phosphomolybdic acid and phosphotungstic acid.

Illustrative examples of organic electron-accepting substances include aromatic sulfone compounds such as benzenesulfonic acid, tosylic acid, p-styrenesulfonic acid, 2-naphthalenesulfonic acid, 4-hydroxybenzenesulfonic acid, 5-sulfosalicyclic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid, the 1,4-benzodioxanedisulfonic acid compounds mentioned in WO 2005/000832, the arylsulfonic acid compounds mentioned in WO 2006/025342, the arylsulfonic acid compounds mentioned in WO 2009/096352 and polystyrenesulfonic acid; non-aromatic sulfone compounds such as 10-camphorsulfonic acid; and organic oxidizing agents such as 7,7,8,8-tetracyanoquinodimethane (TCNQ) and 2,3-dichloro-5,6-dicyano-1,4-benzoquinone (DDQ).

These inorganic and organic electron-accepting substances may be of a single type used alone, or may be of two or more types used in combination.

Of these, aromatic sulfonic acid compounds are preferred, arylsulfonic acid compounds of formula (7) are more preferred, and arylsulfonic acid compounds of formula (8) are especially preferred.

[Chemical Formula 7]

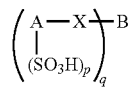
(7)

In above formula (7), X is oxygen or sulfur, with oxygen being preferred.

A is a naphthalene ring or anthracene ring which may have, as substituents other than X and the number p of SO$_3$H groups, one or more substituent selected from among halogen atoms, nitro groups, cyano groups, hydroxyl groups, thiol groups, phosphate groups, sulfonic acid groups, carboxyl groups, alkoxy groups of 1 to 20 carbons, thioalkoxy groups of 1 to 20 carbons, alkyl groups of 1 to 20 carbons, haloalkyl groups of 1 to 20 carbons, cycloalkyl groups of 3 to 20 carbons, bicycloalkyl groups of 6 to 20 carbons, alkenyl groups of 2 to 20 carbons, alkenyl groups of 2 to 20 carbons, aryl groups of 6 to 20 carbons, aralkyl groups of 7 to 20 carbons and acyl groups of 1 to 20 carbons. A naphthalene ring or anthracene ring with no substituents other than SO$_3$H groups is especially preferred.

B is a divalent or trivalent benzene ring, a divalent p-xylylene group, a divalent or trivalent naphthalene ring, a divalent to tetravalent perfluorobiphenyl group, or a divalent 2,2-bis((hydroxypropoxy)phenyl)propyl group.

Examples of the respective substituents on A and B include the same as those mentioned above.

Also, the letter "p" is an integer from 1 to 4 representing the number of sulfonic acid groups bonded to A.

The letter "q" is an integer from 2 to 4 representing the number of bonds between B and X.

[Chemical Formula 8]

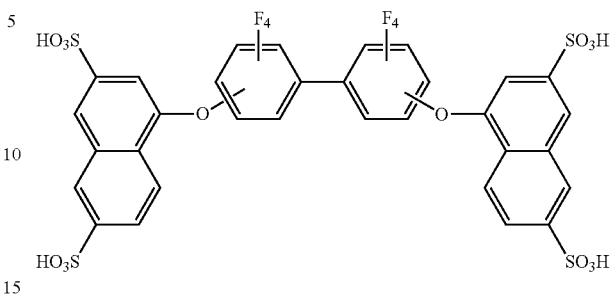
(8)

Illustrative examples of hole-accepting dopants include, but are not limited to, alkali metals (Li, Na, K, Cs) and metal complexes such as lithium quinolinolate (Liq) and lithium acetylacetonate (Li(acac)).

In addition to including, as described above, a good solvent, a poor solvent, a charge-transporting substance, and a charge-accepting dopant which is optionally used, the charge-transporting varnish of the invention must have a viscosity at 25° C. of 7.5 mPa·s or less and a surface tension at 23° C. of from 30.0 to 40.0 mN/m.

Even when the absolute value |ΔT| of the boiling point difference between the good solvent and the poor solvent is less than 20° C., if either the viscosity or the surface tension of the varnish falls outside the above respective ranges, the uniformity of the resulting charge-transporting thin-film decreases and irregularities form at the surface.

To further increase the surface uniformity of the charge-transporting thin-film and achieve a good reproducibility, the viscosity of the varnish is more preferably 7.0 mPa·s or less, and still more preferably 6.9 mPa·s or less. This viscosity has no particular lower limit, although the minimum value is generally about 1.0 mPa·s.

For similar reasons, the surface tension of the varnish at 23° C. is more preferably from 30.5 to 39.0 mN/m, and even more preferably from 30.7 to 33.5 mN/m.

From the standpoint of, for example, adjusting in this way the viscosity of the varnish, it is preferable to use, as one type of good solvent or poor solvent included in the charge-transporting varnish of the invention, a solvent which has a viscosity at 25° C. of from 0.1 to 200 mPa·s, and especially 0.1 to 100 mPa·s, and a boiling point at normal pressure of from 50 to 300° C., and especially from 100 to 250° C.

Illustrative examples of such solvents include the following solvents mentioned above as examples of poor solvents: cyclohexanol, ethylene glycol, ethylene glycol diglycidyl ether, 1,3-octylene glycol, dipropylene glycol, tripropylene glycol, 1,3-butanediol, 1,4-butanediol, 2,3-butanediol, propylene glycol, hexylene glycol, diethylene glycol monoethyl ether acetate, diethylene glycol dimethyl ether, diethylene glycol diethyl ether, diethylene glycol monobutyl ether acetate and triethylene glycol dimethyl ether. Of these, from the standpoint of having a suitable viscosity and boiling point and exhibiting a good coatability on a substrate, cyclohexanol, dipropylene glycol, diethylene glycol monoethyl ether acetate, diethylene glycol dimethyl ether, diethylene glycol diethyl ether, diethylene glycol monobutyl ether acetate and triethylene glycol dimethyl ether are especially preferred.

The viscosity is a value measured with a TVE-22L viscometer (temperature of thermostatic chamber set to 25° C.) available from Toki Sangyo Co., Ltd.

In the charge-transporting varnish of the invention, in order to satisfy the above-indicated ranges for the viscosity and surface tension of the varnish, the amounts in which the good solvent and the poor solvent are included vary depending on, for example, the particular solvents used and the types and amounts of charge-transporting substances used, and thus cannot be strictly specified. However, the good solvent is generally used in an amount, relative to the overall solvent, of from 1 to 90 wt % (together with from 10 to 99 wt % of poor solvent), preferably from 10 to 90 wt % (together with 10 to 90 wt % of poor solvent), more preferably from 20 to 90 wt % (together with from 10 to 80 wt % of poor solvent), and even more preferably from 30 to 90 wt % (together with from 10 to 70 wt % of poor solvent). At this time, it is preferable for the charge-transporting material be dissolved by the good solvent.

The solids concentration of the charge-transporting varnish is set as appropriate based on such factors as the viscosity and surface tension of the varnish, and also characteristics such as the thickness of the thin film to be produced, but is generally from about 0.1 wt % to about 10.0 wt %, preferably from 0.5 to 5.0 wt %, and more preferably from 1.0 to 3.0 wt %.

In addition, the molar ratio of the charge-accepting dopant substance to the charge-transporting substance is set as appropriate based on such factors as the viscosity and surface tension of the varnish while also taking into account, for example, the charge transportability to be manifested and the type of charge-transporting substance. Generally, however, in terms of the molar ratio, the amount of charge-accepting dopant is set to from 0.1 to 10 moles, preferably from 0.5 to 5.0 moles, and more preferably from 1.0 to 3.0 moles, per mole of the charge-transporting substance.

By coating the above-described charge-transporting varnish onto a substrate and evaporating off the solvent, a charge-transporting thin-film can be formed on the substrate.

Examples of the varnish coating method include, but are not particularly limited to, dipping, spin coating, transfer printing, roll coating, brush coating, inkjet printing, spraying and slit coating. To provide a thin-film of even better uniformity and flatness, a slit coating process which can be used for coating onto large surface-area substrates and the like is especially suitable for the charge-transporting varnish of the invention.

Examples of methods for evaporating the solvent include, but are not particularly limited to, evaporation using a heating device such as a hot plate or oven in a suitable atmosphere, such as in open air, in an inert gas such as nitrogen, or in a vacuum. It is possible in this way to obtain a thin-film having a uniform film surface.

Although the baking temperature is not subject to any particular limitation so long as the solvent can be evaporated off, a baking temperature of from 40 to 250° C. is preferred. In this case, a temperature change in two or more steps may be applied for such purposes as to manifest a more uniform film formability or to induce the reaction to proceed on the substrate.

The thickness of the charge-transporting thin-film is not particularly limited; when used as a charge injection layer in an organic EL device, a film thickness of from 5 to 200 nm is preferred. Methods of varying the film thickness include varying the solids concentration in the varnish, and varying the amount of solution on the substrate during coating.

When thin-films with a thickness of 30 nm are formed by slit coating using the charge-transporting varnish of the invention, it is possible to obtain thin-films having a thickness variation of not more than ±4 nm, and even thin-films with a thickness variation of not more than ±3 nm can be reproducibly obtained.

Examples of the materials and method used to fabricate OLEDs using the charge-transporting varnish of the invention include, but are not limited to, those mentioned below.

The electrode substrate to be used is preferably cleaned beforehand with a cleaning agent, alcohol, pure water or the like. For example, in the case of a positive electrode substrate, it is preferable to carry out surface treatment such as UV/ozone treatment or oxygen-plasma treatment just prior to use. However, in cases where the positive electrode material is composed primarily of an organic substance, surface treatment need not be carried out.

Examples of methods for manufacturing OLEDs using the charge-transporting varnish of the invention include the following.

A hole-transporting thin-film is produced on an electrode by using a slit coating method or the like to coat the charge-transporting varnish (hole-transporting varnish) of the invention onto a positive electrode substrate, then carrying out evaporation and baking by the above methods. This thin-film is introduced into a vacuum deposition system and a hole transport layer, emissive layer, electron transport layer, electron injection layer and negative electrode metal are vapor-deposited in this order to form an OLED. Carrier block layers may be provided to desired layer intervals so as to control the light-emitting region.

Illustrative examples of the positive electrode material include transparent electrodes such as indium-tin oxide (ITO) and indium-zinc oxide (IZO). A positive electrode material on which planarizing treatment has been carried out is preferred. Use can also be made of polythiophene derivatives and polyaniline derivatives having a high charge transportability.

Illustrative examples of the hole transport layer-forming material include triarylamines such as (triphenylamine) dimer (TPD) derivatives, (α-naphthyldiphenylamine) dimer (α-NPD) and [(triphenylamine) dimer] spirodimer (Spiro-TAD); starburst amines such as 4,4',4"-tris[3-methylphenyl (phenyl)-amino]triphenylamine (m-MTDATA) and 4,4',4"-tris[1-naphthyl(phenyl)amino]triphenylamine (1-TNATA); and oligothiophenes such as 5,5"-bis-[4-[bis(4-methylphenyl)-amino]phenyl]-2,2':5',2"-terthiophene (BMA-3T).

Illustrative examples of the emissive layer-forming material include tris(8-quinolinolate) aluminum(III) ($Alq_3$), bis (8-quinolinolate) zinc (II) ($Znq_2$), bis(2-methyl-8-quinolinolate) (p-phenylphenolate) aluminum(III) (BAlq) and 4,4'-bis (2,2-diphenylvinyl)biphenyl (DPVBi). It is also possible to form the emissive layer by the co-vapor deposition of an electron-transporting material or hole-transporting material with a light-emitting dopant.

Illustrative examples of the electron-transporting material include $Alq_3$, BAlq, DPVBi, (2-(4-biphenyl)-5-(4-t-butylphenyl)-1,3,4-oxadiazole) (PBD), triazole derivatives (TAZ), bathocuproin (BCP) and silole derivatives.

Illustrative examples of light-emitting dopants include quinacridone, rubrene, coumarin 540, 4-(dicyanomethylene)-2-methyl-6-(p-dimethylaminostyryl)-4H-pyran (DCM), tris(2-phenylpyridine) iridium(iii) ($Ir(ppy)_3$) and (1,10-phenanthroline)tris(4,4,4-trifluoro-1-(2-thienyl)butane-1,3-dionate) europium(III) ($Eu(TTA)_3$-phen).

Illustrative examples of the carrier block layer-forming material include PBD, TAZ and BCP.

Illustrative examples of the electron injection layer-forming material include lithium oxide ($Li_2O$), magnesium oxide (MgO), alumina ($Al_2O_3$), lithium fluoride (LiF), sodium fluoride (NaF), magnesium fluoride (MgF$_2$), strontium fluoride (SrF$_2$), Liq, Li(acac), lithium acetate and lithium benzoate.

Illustrative examples of the negative electrode material include aluminum, magnesium-silver alloys, aluminum-lithium alloys, lithium, sodium, potassium and cesium.

The method of fabricating polymer LEDs (PLEDs) using the charge-transporting varnish of the invention is exemplified by the following method.

The charge-transporting varnish (hole-transporting varnish) of the invention is coated onto a positive electrode substrate by slit coating or the like, following which evaporation and baking are carried out by the above methods, producing a hole-transporting thin-film on the electrode. A light-emitting charge-transporting polymer layer is then formed on top thereof, and a negative electrode is vapor deposited on the polymer layer to form a PLED.

The negative electrode and positive electrode materials used here may be similar to those used when fabricating OLEDs as described above, and similar cleaning treatment and surface treatment may be carried out.

The method of forming the light-emitting charge-transporting polymer layer is exemplified by a film-forming method in which a light-emitting charge-transporting polymer material, or a material obtained by adding thereto a light-emitting dopant, is dissolved or uniformly dispersed by the addition of a solvent, the resulting solution or dispersion is coated onto an electrode substrate having a hole injection layer formed thereon, and the solvent is subsequently removed by evaporation.

Illustrative examples of light-emitting charge-transporting polymer materials include polyfluorene derivatives such as poly(9,9-dialkylfluorene) (PDAF), polyphenylenevinylene derivatives such as poly(2-methoxy-5-(2'-ethylhexoxy)-1,4-phenylenevinylene) (MEH-PPV), polythiophene derivatives such as poly(3-alkylthiophene) (PAT), and polyvinylcarbazole (PVCz).

Illustrative examples of the solvent include toluene, xylene and chloroform. Examples of the method of dissolution or uniform dispersion include stirring, stirring under applied heat, and ultrasonic dispersion.

Examples of the coating method include, but are not particularly limited to, inkjet printing, spraying, dipping, spin coating, transfer printing, roll coating and brush coating. Coating is preferably carried out in an inert gas atmosphere such as nitrogen or argon.

Examples of the solvent evaporation method include methods that involve heating in an oven or on a hot plate and within an inert gas atmosphere or a vacuum.

EXAMPLES

Working Examples and Comparative Examples are given below to more concretely illustrate the invention, although the invention is not limited by these Examples. The equipment used in the Examples was as follows.
(1) Viscosity
Instrument: TVE-22L viscometer, from Toki Sangyo Co., Ltd.
Measurement temperature: Measurement is carried out after setting the thermostatic chamber of the viscometer to 25° C.
(2) Surface Tension
Instrument: CBVP-Z automatic surface tensiometer, from Kyowa Interface Science Co., Ltd.
Measurement temperature: Measurement is carried out at an ambient temperature of 23° C.
(3) Thin-Film Formation Instrument: T2 slit die coater, from Techno-machine KK
(4) Film Thickness Measurement Instrument: Surfcorder ET-4000 microfigure measuring instrument, from Kosaka Laboratory, Ltd.
(5) Substrate Cleaning Instrument: Substrate cleaning machine (low-pressure plasma system), from Choshu Industry Co., Ltd.

[1] Compound Synthesis

Synthesis Example 1

Synthesis of Aniline Derivative

The oligoaniline derivative of formula (6) (abbreviated below as BDPA-PTA) used in the Working Examples was synthesized based on the description in WO 2008/129947 and in accordance with the reaction scheme shown below. The $^1$H-NMR measurement results for the resulting oligoaniline compound were as follows.

$^1$H-NMR (CDCl$_3$): δ 7.83 (S, 2H), 7.68 (S, 1H), 7.26-7.20 (m, 8H), 7.01-6.89 (m, 28H).

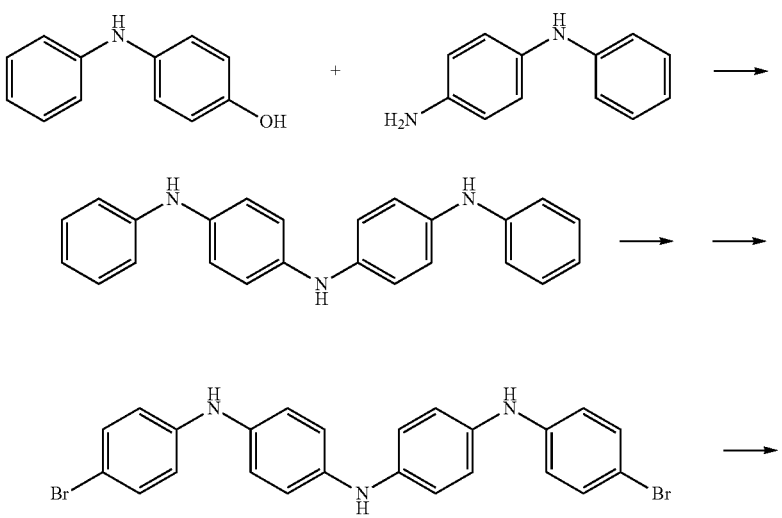

-continued

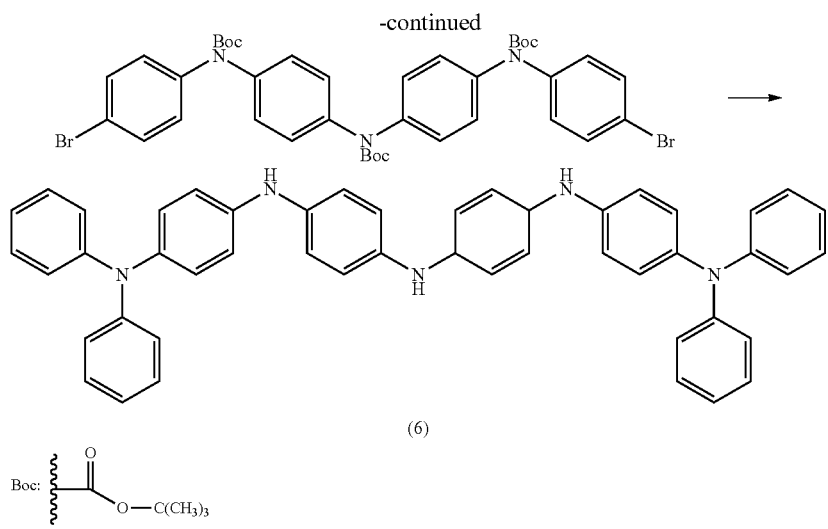

(6)

[2] Varnish Preparation and Thin-Film Production and Evaluation

Example 1

First, 1.056 g (2.385 mmol) of phenyltetraaniline (abbreviated below as "PTA") of formula (5) synthesized by the method described in *Bulletin of Chemical Society*, 67, 1749-1752 (1994) and 3.230 g (3.578 mmol) of naphthalenedisulfonic acid oligomer (abbreviated below as "NSO-2") of formula (8) were completely dissolved, under a nitrogen atmosphere, in 189 g of the good solvent N,N-dimethylacetamide (abbreviated below as "DMAc").

Next, 21 g of the poor solvent 2,3-butanediol (abbreviated below as "2,3-BD") was added to the resulting solution and stirring was carried out, thereby preparing a charge-transporting varnish (solids content, 2.0 wt %).

[Chemical Formula 9]

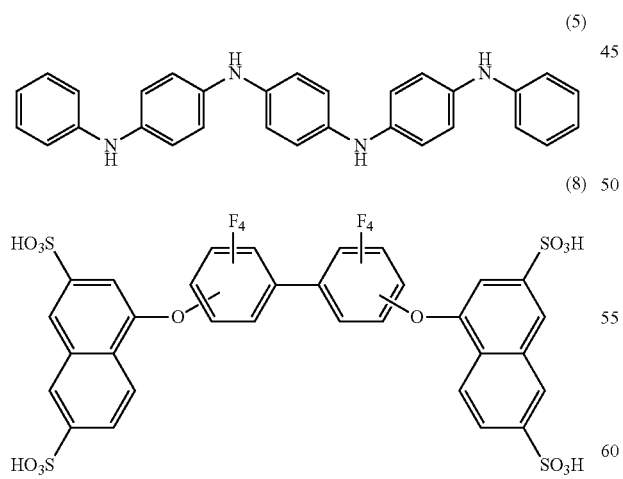

Example 2

Aside from changing the amount of DMAc used to 105 g and using 105 g of diethylene glycol dimethyl ether (abbreviated below as "Diglyme") instead of the 21 g of 2,3-BD, a charge-transporting varnish (solids content, 2.0 wt %) was prepared in the same way as in Example 1.

Example 3

Aside from using 105 g of 1,3-dimethyl-2-imidazolidinone (abbreviated below as "DMI") instead of 189 g of DMAc and using 105 g of diethylene glycol monoethyl ether acetate (abbreviated below as "ECA") instead of 21 g of 2,3-BD, a charge-transporting varnish (solids content, 2.0 wt 8) was prepared in the same way as in Example 1.

Example 4

Aside from using 178.5 g of DMI instead of 189 g of DMAc and using 31.5 g of diethylene glycol monobutyl ether (abbreviated below as "DEGMBE") instead of 21 g of 2,3-BD, a charge-transporting varnish (solids content, 2.0 wt %) was prepared in the same way as in Example 1.

Example 5

Aside from setting the amount of DMAc used to 147 g and setting the amount of 2,3-BD used to 63 g, a charge-transporting varnish (solids content, 2.0 wt %) was prepared in the same way as in Example 1.

Example 6

Aside from setting the amount of DMAc used to 84 g and using 126 g of cyclohexanol (abbreviated below as "CHA") instead of 2,3-BD, a charge-transporting varnish (solids content, 2.0 wt 5) was prepared in the same way as in Example 1.

Example 7

Aside from setting the amount of DMAc used to 105 g and setting the amount of 2,3-BD used to 105 g, a charge-transporting varnish (solids content, 2.0 wt %) was prepared in the same way as in Example 1.

Example 8

Aside from setting the amount of DMAc used to 94.5 g and setting the amount of 2,3-BD used to 115.5 g, a charge-transporting varnish (solids content, 2.0 wt %) was prepared in the same way as in Example 1.

Example 9

Aside from using 84 g of N-methylpyrrolidone (abbreviated below as "NMP") instead of 189 g of DMAc and using 126 g of diethylene glycol diethyl ether (abbreviated below as "Ethyl diglyme") instead of 21 g of 2,3-BD, a charge-transporting varnish (solids content, 2.0 wt %) was prepared in the same way as in Example 1.

Example 10

Aside from using 105 g of NMP instead of 189 g of DMAc and using 105 g of Ethyl diglyme instead of 21 g of 2,3-BD, a charge-transporting varnish (solids content, 2.0 wt %) was prepared in the same way as in Example 1.

Example 11

Aside from changing the amount of DMAc used to 147 g and using 63 g of n-hexylacetate (abbreviated below as "nHAc") instead of 21 g of 2,3-BD, a charge-transporting varnish (solids content, 2.0 wt %) was prepared in the same way as in Example 1.

Example 12

Aside from changing the amount of DMAc used to 105 g and using 21 g of 2,3-BD and 84 g of ethylene glycol monoethyl ether acetate (abbreviated below as "EGMEEAc") instead of 21 g of 2,3-BD, a charge-transporting varnish (solids content, 2.0 wt 5) was prepared in the same way as in Example 1.

Example 13

Aside from changing the amount of DMAc used to 84 g and using 126 g of Diglyme instead of 21 g of 2,3-BD, a charge-transporting varnish (solids content, 2.0 wt %) was prepared in the same way as in Example 1.

Example 14

Aside from using 105 g of DMI instead of 189 g of DMAc and using 105 g of triethylene glycol dimethyl ether (abbreviated below as "Triglyme") instead of 21 g of 2,3-BD, a charge-transporting varnish (solids content, 2.0 wt %) was prepared in the same way as in Example 1.

Example 15

Aside from using 184 g of DMI instead of 189 g of DMAc and using 63 g of 2-phenoxyethanol (abbreviated below as "2-PE") and 63 g of ECA instead of 21 g of 2,3-BD, a charge-transporting varnish (solids content, 2.0 wt %) was prepared in the same way as in Example 1.

Example 16

Aside from using 168 g of DMI instead of 189 g of DMAc and using 42 g of 1,3-butanediol (abbreviated below as "1,3-BD") instead of 21 g of 2,3-BD, a charge-transporting varnish (solids content, 2.0 wt 5) was prepared in the same way as in Example 1.

Example 17

Aside from using 126 g of DMI instead of 189 g of DMAc and using 84 g of tripropylene glycol monomethyl ether (abbreviated below as "TPGMME") instead of 21 g of 2,3-BD, a charge-transporting varnish (solids content, 2.0 wt %) was prepared in the same way as in Example 1.

Example 18

Aside from setting the amount of DMAc used to 147 g and using 63 g of ethylene glycol monoethyl ether acetate (abbreviated below as "EGMEEAc") instead of 21 g of 2,3-BD, a charge-transporting varnish (solids content, 2.0 wt %) was prepared in the same way as in Example 1.

Example 19

Aside from using 126 g of DMI instead of 189 g of DMAc and using 84 g of ethylene glycol monohexyl ether (abbreviated below as "EGMHE") instead of 21 g of 2,3-BD, a charge-transporting varnish (solids content, 2.0 wt %) was prepared in the same way as in Example 1.

Comparative Example 1

Aside from setting the amount of DMAc used to 84 g and setting the amount of 2,3-BD used to 126 g, a charge-transporting varnish (solids content, 2.0 wt %) was prepared in the same way as in Example 1.

Comparative Example 2

Aside from setting the amount of DMAc used to 73.5 g and setting the amount of 2,3-BD used to 136.5 g, a charge-transporting varnish (solids content, 2.0 wt %) was prepared in the same way as in Example 1.

Comparative Example 3

Aside from setting the amount of DMAc used to 63 g and setting the amount of 2,3-BD used to 147 g, a charge-transporting varnish (solids content, 2.0 wt %) was prepared in the same way as in Example 1.

Comparative Example 4

Aside from setting the amount of DMAc used to 126 g and using 84 g of nHAc instead of 21 g of 2,3-BD, a charge-transporting varnish (solids content, 2.0 wt %) was prepared in the same way as in Example 1.

Comparative Example 5

Aside from using 189 g of DMI instead of 189 g of DMAc and using 21 g of 2-PE instead of 21 g of 2,3-BD, a charge-transporting varnish (solids content, 2.0 wt %) was prepared in the same way as in Example 1.

Comparative Example 6

Aside from setting the amount of DMAc used to 147 g and using 63 g of triethylene glycol monomethyl ether (abbreviated below as "TEGMME") instead of 21 g of 2,3-BD, a charge-transporting varnish (solids content, 2.0 wt %) was prepared in the same way as in Example 1.

Comparative Example 7

Aside from using 105 g of DMI instead of 189 g of DMAc and using 105 g of triethylene glycol monoethyl ether (abbreviated below as "TEGMEE") instead of 21 g of 2,3-BD, a charge-transporting varnish (solids content, 2.0 wt) was prepared in the same way as in Example 1.

Comparative Example 8

Aside from using 126 g of DMI instead of 189 g of DMAc and using 84 g of diethylene glycol monobutyl ether acetate (abbreviated below as "DEGMBEAc") instead of 21 g of 2,3-BD, a charge-transporting varnish (solids content, 2.0 wt) was prepared in the same way as in Example 1.

Comparative Example 9

Aside from using 105 g of DMI instead of 189 g of DMAc and using 105 g of diethylene glycol monoethyl ether (abbreviated below as "DEGMEE") instead of 21 g of 2,3-BD, a charge-transporting varnish (solids content, 2.0 wt 5) was prepared in the same way as in Example 1.

Comparative Example 10

Aside from using 168 g of DMI instead of 189 g of DMAc and using 42 g of propylene glycol monomethyl ether (abbreviated below as "PGME") instead of 21 g of 2,3-BD, a charge-transporting varnish (solids content, 2.0 wt %) was prepared in the same way as in Example 1.

Comparative Example 11

A charge-transporting varnish (solids content, 2.0 wt %) was prepared by completely dissolving 1.056 g (2.385 mmol) of PTA and 3.230 g (3.578 mmol) of NSO-2 in 210 g of DMAc under a nitrogen atmosphere.

Comparative Example 12

Aside from using DMI instead of DMAc, a charge-transporting varnish (solids content, 2.0 wt %) was prepared in the same way as in Comparative Example 11.

The varnishes prepared in the respective Working Examples and Comparative Examples were coated onto substrates having a blanket film of ITO deposited thereon (referred to below as "ITO substrate") (substrate dimensions: 120 mm×120 mm; thickness, 0.7 mm) using a slit die coater, then dried for 5 minutes in open air on a 50° C. hot plate and baked for 15 minutes on a 230° C. hot plate, thereby forming a thin-film on the substrate.

The ITO substrate was used after removing impurities on the surface with an $O_2$ plasma cleaning system (150 W, 30 seconds). The coating conditions using the slit coater were set to a coating area of 120 mm×120 mm, a gap of 20 μm, and a coating interval of 4 seconds, a coating speed of 10 mm/sec, and a target film thickness of 30 nm.

Next, the film thickness distribution of the resulting thin-film was evaluated. Evaluation was carried out by taking measurements at a total of five places—the four corners and approximate center—of a thin-film formed in a square shape, and numerically expressing the in-plane uniformity of the film thickness at the five places as a film thickness distribution. The viscosities and surface tensions of each varnish, the boiling point difference between the good solvent and poor solvent used for preparing the varnish (good solvent boiling point (° C.)−poor solvent boiling point (° C.)), the absolute value of the boiling point difference, and the film thickness distribution evaluation results are all shown in Tables 1 to 4.

Table 1 shows cases in which the influence of the varnish viscosity on the film thickness distribution is easy to evaluate, Table 2 shows cases in which the influence of the varnish surface tension on the film thickness distribution is easy to evaluate, and Table 3 shows cases in which the influence of the boiling point difference between the good solvent and the poor solvent on the film thickness distribution is easy to evaluate.

Table 4 shows the results obtained using the single-solvent compositions in Comparative Examples 11 and 12.

TABLE 1

| | Solvent composition (weight ratio) | Viscosity (mPa·s) | Surface tension (mN/m) | Boiling point difference ΔT (° C.) | |ΔT| (° C.) | Film thickness distribution | |
|---|---|---|---|---|---|---|---|
| Comparative Example 3 | DMAc:2,3-BD 30:70 | 12.7 | 34.3 | −15.9 | 15.9 | 30 nm ± 11 nm | 36.5% |
| Comparative Example 2 | DMAc:2,3-BD 35:65 | 10.8 | 34.7 | −15.5 | 15.9 | 30 nm ± 8 nm | 26.6% |
| Comparative Example 1 | DMAc:2,3-BD 40:60 | 8.1 | 34.3 | −15.9 | 15.9 | 30 nm ± 5 nm | 16.7% |
| Example 8 | DMAc:2,3-BD 45:55 | 6.8 | 35.3 | −15.9 | 15.9 | 30 nm ± 3 nm | 10.0% |
| Example 7 | DMAc:2,3-BD 50:50 | 5.2 | 34.9 | −15.9 | 15.9 | 30 nm ± 3 nm | 10.0% |
| Example 6 | DMAc:CHA 40:60 | 5.0 | 34.7 | 5.0 | 15.9 | 30 nm ± 3 nm | 10.0% |
| Example 5 | DMAc:2,3-BD 3:30 | 2.9 | 35.9 | −15.9 | 15.9 | 30 nm ± 3 nm | 10.0% |
| Example 4 | DMI:DEGMBE 85:15 | 2.5 | 38.3 | −5.4 | 5.4 | 30 nm ± 3 nm | 10.0% |
| Example 3 | DMI:ECA 50:50 | 2.4 | 35.7 | 7.6 | 7.6 | 30 nm ± 3 nm | 10.0% |
| Example 2 | DMAc:Diglyme 50:50 | 1.7 | 33.0 | 6.5 | 6.5 | 30 nm ± 3 nm | 10.0% |

TABLE 1-continued

|  | Solvent composition (weight ratio) | Viscosity (mPa·s) | Surface tension (mN/m) | Boiling point difference ΔT (° C.) | \|ΔT\| (° C.) | Film thickness distribution | |
|---|---|---|---|---|---|---|---|
| Example 1 | DMAc:2,3-BD 90:10 | 1.5 | 36.6 | −15.9 | 15.9 | 30 nm ± 3 nm | 10.0% |

As shown in Table 1, the film thickness variation in thin-films produced using the varnishes having viscosities of 7.5 mPa·s or less prepared in Examples 1 to 8 was smaller than in thin-films having viscosities of more than 7.5 mPa·s produced using the varnishes prepared in Comparative Examples 1 to 3.

TABLE 2

|  | Solvent composition (weight ratio) | Viscosity (mPa·s) | Surface tension (mN/m) | Boiling point difference ΔT (° C.) | \|ΔT\| (° C.) | Film thickness distribution | |
|---|---|---|---|---|---|---|---|
| Comparative Example 4 | DMAc:nHAc 60:40 | 1.5 | 29.8 | −3.1 | 3.1 | 30 nm ± 7 nm | 23.0% |
| Example 9 | NMP:Ethyl diglyme 40:60 | 3.0 | 30.1 | 13.6 | 13.6 | 30 nm ± 4 nm | 13.5% |
| Example 10 | NMP:Ethyl diglyme 50:50 | 3.0 | 30.9 | 13.6 | 13.6 | 30 nm ± 3 nm | 10.0% |
| Example 11 | DMAc:nHAc 70:30 | 1.4 | 31.0 | −3.1 | 3.1 | 30 nm ± 3 nm | 10.0% |
| Example 12 | DMAc:2,3-BD:EGMEEAc 50:10:40 | 1.5 | 32.1 | −15.9 | 15.9 | 30 nm ± 3 nm | 10.0% |
| Example 2 | DMAc:Diglyme 50:50 | 1.7 | 33.0 | 6.5 | 6.5 | 30 nm ± 3 nm | 10.0% |
| Example 13 | DMAc40:Diglyme 40:60 | 3.0 | 34.1 | 6.5 | 6.5 | 30 nm ± 3 nm | 10.0% |
| Example 6 | DMAc:CHA 40:60 | 5.0 | 34.7 | 5.0 | 5.0 | 30 nm ± 3 nm | 10.0% |
| Example 7 | DMAc:2,3-BD 50:50 | 5.2 | 34.9 | −15.9 | 15.9 | 30 nm ± 3 nm | 10.0% |
| Example 14 | DMI:Triglyme 50:50 | 2.3 | 35.1 | 9.0 | 9.0 | 30 nm ± 3 nm | 10.0% |
| Example 3 | DMI:ECA 50:50 | 2.4 | 35.7 | 7.6 | 7.6 | 30 nm ± 3 nm | 10.0% |
| Example 5 | DMAc:2,3-BD 70:30 | 2.9 | 35.9 | −15.9 | 15.9 | 30 nm ± 3 nm | 10.0% |
| Example 1 | DMAc:2,3-BD 90:10 | 1.5 | 36.6 | −15.9 | 15.9 | 30 nm ± 3 nm | 10.0% |
| Example 15 | DMI:2-PE:ECA 40:30:30 | 4.1 | 36.9 | −12.0 | 12.0 | 30 nm ± 3 nm | 10.0% |
| Example 4 | DMI:DEGMBE 85:15 | 2.5 | 38.3 | −5.4 | 5.4 | 30 nm ± 3 nm | 10.0% |
| Example 16 | DMI:1,3-BD 80:20 | 4.7 | 39.7 | 17.6 | 17.6 | 30 nm ± 4 nm | 13.5% |
| Comparative Example 5 | DMI:2-PE 90:10 | 3.2 | 42.4 | −12.0 | 12.0 | 30 nm ± 9 nm | 30.0% |

As shown in Table 2, the film thickness variation in thin-films produced using the varnishes having surface tensions in the range of 30.0 to 40.0 mN/m prepared in the working examples of the invention was smaller than in thin-films produced using the varnishes having surface tensions outside of the above range prepared in Comparative Examples 4 and 5.

TABLE 3

|  | Solvent composition (weight ratio) | Viscosity (mPa·s) | Surface tension (mN/m) | Boiling point difference ΔT (° C.) | \|ΔT\| (° C.) | Film thickness distribution | |
|---|---|---|---|---|---|---|---|
| Comparative Example 6 | DMAc:TEGMME 70:30 | 1.8 | 37.5 | −82.9 | 82.9 | 30 nm ± 7 nm | 23.0% |

TABLE 3-continued

|  | Solvent composition (weight ratio) | Viscosity (mPa·s) | Surface tension (mN/m) | Boiling point difference ΔT (° C.) | \|ΔT\| (° C.) | Film thickness distribution | |
|---|---|---|---|---|---|---|---|
| Comparative Example 7 | DMI:TEGMEE 50:50 | 5.0 | 36.5 | −30.9 | 30.9 | 30 nm ± 6 nm | 20.0% |
| Comparative Example 6 | DMI:DEGMBEAc 60:40 | 3.1 | 34.4 | −21.8 | 21.8 | 30 nm ± 5 nm | 16.7% |
| Example 17 | DMI:TPGMME 60:40 | 6.2 | 30.0 | −18.0 | 18.0 | 30 nm ± 3 nm | 10.0% |
| Example 7 | DMAc:2,3-BD 50:50 | 5.2 | 34.9 | −15.9 | 15.9 | 30 nm ± 3 nm | 10.0% |
| Example 5 | DMAc:2,3-BD 70:30 | 2.9 | 35.9 | −15.9 | 15.9 | 30 nm ± 3 nm | 10.0% |
| Example 1 | DMAc:2,3-BD 90:10 | 1.5 | 36.6 | −15.9 | 15.9 | 30 nm ± 3 nm | 10.0% |
| Example 4 | DMI:DEGMBE 85:15 | 2.5 | 38.3 | −5.4 | 5.4 | 30 nm ± 3 nm | 10.0% |
| Example 2 | DMAc:Diglyme 50:50 | 1.7 | 33.0 | 6.5 | 6.5 | 30 nm ± 3 nm | 10.0% |
| Example 6 | DMAc:CHA 40:60 | 5.0 | 34.7 | 5.0 | 5.0 | 30 nm ± 3 nm | 10.0% |
| Example 3 | DMI:ECA 50:50 | 2.4 | 35.7 | 7.5 | 7.5 | 30 nm ± 3 nm | 10.0% |
| Example 18 | DmAc:EGMEEAc 70:30 | 0.9 | 33.5 | 9.3 | 9.3 | 30 nm ± 3 nm | 10.0% |
| Example 19 | DMI:EGMHE 60:40 | 3.4 | 32.4 | 16.9 | 16.9 | 30 nm ± 3 nm | 10.0% |
| Comparative Example 9 | DMI:DEGMEE 50:50 | 4.1 | 36.3 | 30.0 | 30.0 | 30 nm ± 6 nm | 20.0% |
| Comparative Example 10 | DMI:PGME 80:20 | 2.4 | 37.5 | 105.0 | 105.0 | 30 nm ± 8 nm | 26.7% |

As shown in Table 3, the film thickness variation in thin-films produced using the varnishes prepared in the working examples of the invention for which the boiling point difference between the good solvent and the poor solvent had an absolute value |ΔT|<20° C. was smaller than in thin-films produced using the varnishes prepared in Comparative Examples 6 to 10 for which the absolute value |ΔT| of the boiling point difference between the good solvent and the poor solvent was 20° C. or more.

TABLE 4

|  | Solvent composition (weight ratio) | Viscosity (mPa·s) | Surface tension (mN/m) | Boiling point difference ΔT (° C.) | \|ΔT\| (° C.) | Film thickness distribution |
|---|---|---|---|---|---|---|
| Comparative Example 11 | DMAc 100 | 0.9 | 36.0 | — | — | film could not be formed |
| Comparative Example 12 | DMI 100 | 1.7 | 41.1 | — | — | film could not be formed |

As shown in Table 4, in cases where varnishes of Comparative Examples 11 and 12 prepared with only a good solvent were used, a thin-film could not be formed with a slit die coater.

Preparation Examples 1 to 19

Comparative Preparation Examples 1 to 10

Aside from using BDPA-PTA instead of PTA, charge-transporting varnishes were prepared by the same methods as in Examples 1 to 19 and Comparative Examples 1 to 10. The viscosities and surface tensions of each varnish, the boiling point difference between the good solvent and the poor solvent used for preparing each varnish (good solvent boiling point (° C.)–poor solvent boiling point (° C.)), and the absolute value of the boiling point difference are shown in Table 5.

TABLE 5

| | Solvent composition (weight ratio) | Viscosity (mPa·s) | Surface tension (mN/m) | Boiling point difference ΔT (° C.) | \|ΔT\| (° C.) |
|---|---|---|---|---|---|
| Comparative Preparation Example 3 | DMAc:2,3-BD 30:70 | 12.5 | 34.4 | −15.9 | 15.9 |
| Comparative Preparation Example 2 | DMAc:2,3-BD 35:65 | 10.9 | 34.6 | −15.9 | 15.9 |
| Comparative Preparation Example 1 | DMAc:2,3-BD 40:60 | 8.2 | 34.9 | −15.9 | 15.9 |
| Preparation Example 8 | DMAc:2,3-BD 45:55 | 6.9 | 35.4 | −15.9 | 15.9 |
| Preparation Example 7 | DMAc:2,3-BD 50:50 | 5.2 | 34.9 | −15.9 | 15.9 |
| Preparation Example 6 | DMAc:CHA 40:60 | 5.1 | 34.7 | 5.0 | 5.0 |
| Preparation Example 5 | DMAc:2,3-BD 70:30 | 3.0 | 35.9 | −15.9 | 15.9 |
| Preparation Example 4 | DMI:DEGMBE 85:15 | 2.5 | 38.4 | −5.4 | 5.4 |
| Preparation Example 3 | DMI:ECA 50:50 | 2.2 | 35.6 | 7.6 | 7.6 |
| Preparation Example 2 | DMAc:Diglyme 50:50 | 1.8 | 33.0 | 6.5 | 6.5 |
| Preparation Example 1 | DMAc:2,3-BD 90:10 | 1.6 | 36.7 | −15.9 | 15.9 |

TABLE 6

| | Solvent composition (weight ratio) | Viscosity (mPa·s) | Surface tension (mN/m) | Boiling point difference ΔT (° C.) | \|ΔT\| (° C.) |
|---|---|---|---|---|---|
| Comparative Preparation Example 4 | DMAc:nHAc 60:40 | 1.6 | 29.8 | −3.1 | 3.1 |
| Preparation Example 9 | NMP:Ethyl diglyme 40:60 | 3.1 | 30.1 | 13.6 | 13.6 |
| Preparation Example 10 | NMP:Ethyl diglyme 50:50 | 3.0 | 30.7 | 13.6 | 13.6 |
| Preparation Example 11 | DMAc:nHAc 70:30 | 1.6 | 31.0 | −3.1 | 3.1 |
| Preparation Example 12 | DMAc:2,3-BD:EGMEEAc 50:10:40 | 1.5 | 32.2 | −15.9 | 15.9 |
| Preparation Example 2 | DMAc:Diglyme 50:50 | 1.8 | 33.0 | 6.5 | 6.5 |
| Preparation Example 13 | DMAc:Diglyme 40:60 | 3.1 | 34.1 | 6.5 | 6.5 |
| Preparation Example 6 | DMAc:CHA 40:60 | 5.1 | 34.7 | 5.0 | 5.0 |
| Preparation Example 7 | DMAc:2,3-BD 50:50 | 5.2 | 34.9 | −15.9 | 15.9 |
| Preparation Example 14 | DMI:Triglyme 50:50 | 2.3 | 35.2 | 9.0 | 9.0 |
| Preparation Example 3 | DMI:ECA 50:50 | 2.2 | 35.6 | 7.6 | 7.6 |
| Preparation Example 5 | DMAc:2,3-BD 70:30 | 3.0 | 35.9 | −15.9 | 15.9 |
| Preparation Example 1 | DMAc:2,3-BD 90:10 | 1.6 | 36.7 | −15.9 | 15.9 |
| Preparation Example 15 | DMI:2-PE:ECA 40:30:30 | 4.1 | 36.8 | −12.0 | 12.0 |
| Preparation Example 4 | DMI:DEGMBE 85:15 | 2.5 | 38.4 | −5.4 | 5.4 |
| Preparation Example 16 | DMI:1,3-BD 80:20 | 4.8 | 39.6 | 17.6 | 17.6 |
| Comparative Preparation Example 5 | DMI:2-PE 90:10 | 3.0 | 42.1 | −12.0 | 12.0 |

TABLE 7

| | Solvent composition (weight ratio) | Viscosity (mPa · s) | Surface tension (mN/m) | Boiling point difference ΔT (° C.) | \|ΔT\| (° C.) |
|---|---|---|---|---|---|
| Comparative Preparation Example 6 | DMAc:TEGMME 70:30 | 1.8 | 37.5 | −82.9 | 82.9 |
| Comparative Preparation Example 7 | DMI:TEGMEE 50:50 | 5.0 | 36.5 | −30.9 | 30.9 |
| Comparative Preparation Example 8 | DMI:DEGMBEAc 60:40 | 3.1 | 34.4 | −21.8 | 21.8 |
| Preparation Example 17 | DMI:TPGMME 60:40 | 6.2 | 35.0 | −18.0 | 18.0 |
| Preparation Example 7 | DMAc:2,3-BD 50:50 | 5.2 | 34.9 | −15.9 | 15.9 |
| Preparation Example 5 | DMAc:2,3-BD 70:30 | 3.0 | 35.9 | −15.9 | 15.9 |
| Preparation Example 1 | DMAc:2,3-BD 90:10 | 1.6 | 36.7 | −15.9 | 15.9 |
| Preparation Example 4 | DMI:DEGMBE 85:15 | 2.5 | 38.4 | −5.4 | 5.4 |
| Preparation Example 2 | DMAc:Diglyme 50:50 | 1.8 | 33.0 | 6.5 | 6.5 |
| Preparation Example 6 | DMAc:CHA 40:60 | 5.1 | 34.7 | 5.0 | 5.0 |
| Preparation Example 3 | DMI:ECA 50:50 | 2.2 | 35.6 | 7.6 | 7.6 |
| Preparation Example 18 | DMAc:EGMEEAc 70:30 | 0.9 | 33.5 | 9.3 | 9.3 |
| Preparation Example 19 | DMI:EGMHE 60:40 | 3.4 | 32.4 | 16.9 | 16.9 |
| Comparative Preparation Example 9 | DMI:DEGMEE 50:50 | 4.1 | 36.3 | 30.0 | 30.0 |
| Comparative Preparation Example 10 | DMI:PGME 80:20 | 2.4 | 37.5 | 105.0 | 105.0 |

As shown in Tables 5 to 7, even in cases where BDPA-PTA was used as the charge-transporting substance, it is possible to achieve a viscosity and a surface tension similar to those in cases where PTA was used.

What this suggests is that, in the former case as well, thin-films having little film thickness variation can be produced with a slit die coater. Hence, not only PTA, but also compounds such as BDPA-PTA encompassed by formula (1) can presumably be used as suitable charge-transporting substances in this invention.

The invention claimed is:

1. A method of producing a charge-transporting thin film having a thickness variation of not more than ±3 nm by slit coating on to a substrate a charge-transporting varnish comprising a charge-transporting substance comprised of a charge-transporting monomer or a charge-transporting oligomer having a number-average molecular weight of from 200 to 5,000 and having no molecular weight distribution, or a charge-transporting material comprised of the charge-transporting substance and a dopant substance; and a mixed solvent containing, in combination, at least one good solvent and at least one poor solvent,
   wherein the good solvent and the poor solvent have a boiling point difference ΔT (° C.) therebetween with an absolute value that satisfies the condition |ΔT|<20° C.,
   the varnish has a viscosity at 25° C. of 7.5 mPa·s or less and a surface tension at 23° C. of from 30.0 to 40.0 mN/m, and
   the charge-transporting substance or charge-transporting material is dissolved or uniformly dispersed in the mixed solvent.

2. The method according to claim 1, wherein the good solvent is at least one selected from the group consisting of N-methylformamide, N,N-dimethylformamide, N,N-diethylformamide, N-methylacetamide, N,N-dimethylacetamide, N-methylpropionamide, N-methylpyrrolidone, 1,3-dimethyl-2-imidazolidinone, trimethyl phosphate, triethyl phosphate, diethylene glycol and triethylene glycol.

3. The method according to claim 1, wherein the poor solvent is at least one selected from the group consisting of ethylene glycol, propylene glycol, dipropylene glycol, hexylene glycol, 1,2-butanediol, 2,3-butanediol, 1,3-butanediol, 1,4-butanediol, 1,5-pentanediol, octylene glycol, glycerol, ethylene glycol monomethyl ether, ethylene glycol monomethyl ether acetate, ethylene glycol monoethyl ether, ethylene glycol diethyl ether, ethylene glycol isopropyl ether, ethylene glycol monobutyl ether, ethylene glycol dibutyl ether, ethylene glycol monobutyl ether acetate, ethylene glycol benzyl ether, ethylene glycol monohexyl ether, 2-methoxyethanol, ethylene glycol monoacetate, ethylene glycol monoisobutyl ether, ethylene glycol monoethyl ether acetate, ethylene glycol diacetate, diethylene glycol monomethyl ether acetate, diethylene glycol monoethyl ether, diethylene glycol monoethyl ether acetate, diethylene glycol monobutyl ether, diethylene glycol monobutyl ether acetate, diethylene glycol dimethyl ether, diethylene glycol methyl ethyl ether, diethylene glycol diethyl ether, diethylene glycol dibutyl ether, diethylene glycol monophenyl ether, triethylene glycol monomethyl ether, triethylene glycol monoethyl ether, triethylene glycol dimethyl ether, tetraethylene glycol, polyethylene glycol, propylene glycol monomethyl ether, propylene glycol monoethyl ether, propylene glycol monopropyl ether, propylene glycol monobutyl ether, propylene glycol monophenyl ether, propylene glycol monomethyl ether acetate, 1-butoxyethoxypropanol, dipropylene glycol monomethyl ether, dipropylene glycol monoethyl ether, dipropylene glycol monopropyl ether, dipropylene glycol monobutyl ether, tripropylene glycol monomethyl ether, trimethylene glycol, methanol, ethanol, 1-propanol, 2-propanol, 1-butanol, 2-butanol, 1-pentanol, 1-hexanol, 1-heptanol, 1-nonanol, 1-decanol, 1-undecanol, 1-dodecanol, 1-tetradecanol, benzyl alcohol, cyclohexanol, 2-methylcyclohexanol, glycidol, furfuryl alcohol, tetrahydrofurfuryl alcohol, diacetone alcohol, 2-ethylhexanol, 2-phenoxyethanol, a-terpineol, ethyl ether, isopropyl ether, di-n-butyl ether, di-n-hexyl ether, anisole, ethyl phenyl ether, n-butyl phenyl ether, benzyl isoamyl ether, o-cresyl methyl ether, m-cresyl methyl ether, p-cresyl methyl ether, ethyl benzyl ether, diglycidyl ether, 1,4-dioxane, trioxane, furfural, 2-methylfuran, tetrahydrofuran, tetrahydropyran, cineol, methylal, diethylacetal, propyl formate, n-butyl formate, isobutyl formate, methyl acetate, ethyl acetate, n-propyl acetate, isopropyl acetate, n-butyl acetate, isobutyl acetate, sec-butyl acetate, n-amyl acetate, isoamyl acetate, methyl isoamyl acetate, n-hexyl acetate, sec-hexyl acetate, 2-ethylbutyl acetate, 2-ethylhexyl acetate, cyclohexyl acetate, methylcyclohexyl acetate, benzyl acetate, methyl propionate, ethyl propionate, n-butyl propionate, isoamyl propionate, methyl butyrate, ethyl butyrate, n-butyl butyrate, isoamyl butyrate, ethyl oxyisobutyrate, butyl stearate, amyl stearate, methyl acetobutyrate, ethyl acetobutyrate, isoamyl isovalerate, methyl lactate, ethyl lactate, n-butyl lactate, isobutyl lactate, n-amyl lactate, isoamyl lactate, methyl benzoate, ethyl benzoate, propyl benzoate, butyl benzoate, isoamyl benzoate, benzyl benzoate, methyl salicylate, diethyl oxalate, dibutyl oxalate, diamyl oxalate, diethyl malonate, tributyl citrate, dioctyl sebacate, dimethyl phthalate, diethyl phthalate, di-n-butyl phthalate, di-2-ethylhexyl phthalate, di-n-octyl phthalate, methyl ethyl ketone, methyl n-propyl ketone, methyl n-butyl ketone, methyl isobutyl ketone, methyl n-amyl ketone, methyl n-hexyl ketone, diethyl ketone, ethyl n-butyl ketone, di-n-propyl ketone, diisobutyl ketone, 2,6,8-trimethylnonan-4-one, acetonylacetone, mesityl oxide, phorone, isophorone, cyclohexanone, methylcyclohexanone, acetophenone, 2-ethylhexanoic acid, oleic acid, lactic acid, phenol, o-cresol, m-cresol, p-cresol, xylenol, heptane, octane, 2,2,3-trimethylhexane, decane, dodecane, toluene, xylene, o-xylene, m-xylene, p-xylene, cumene, mesitylene, tetralin, p-cymene, cyclohexylbenzene, diethylbenzene, pentylbenzene, dipentylbenzene, dodecylbenzene, cyclohexane, methylcyclohexane, ethylcyclohexane, p-menthane, bicyclohexene, a-pinene and dipentene.

4. The method according to claim 1, wherein the combination of the good solvent and the poor solvent is N,N-dimethylacetamide and 2,3-butanediol, N,N-dimethylacetamide and cyclohexanol, N,N-dimethylacetamide and diethylene glycol dimethyl ether, N,N-dimethylacetamide and n-hexylacetate, N,N-dimethylacetamide and ethylene glycol monoethyl ether acetate, 1,3-dimethyl-2-imidazolidinone and diethylene glycol monobutyl ether, 1,3-dimethyl-2-imidazolidinone and diethylene glycol monoethyl ether acetate, 1,3-dimethyl-2-imidazolidinone and triethylene glycol dimethyl ether, 1,3-dimethyl-2-imidazolidinone and 2-phenoxyethanol, 1,3-dimethyl-2-imidazolidinone and 1,3-butanediol, 1,3-dimethyl-2-imidazolidinone and tripropylene glycol monomethyl ether, 1,3-dimethyl-2-imidazolidinone and ethylene glycol monohexyl ether, N-methylpyrrolidone and diethylene glycol diethyl ether, N-methylpyrrolidone and diethylene glycol monoethyl ether acetate, N-methylpyrrolidone and triethylene glycol dimethyl ether, N-methylpyrrolidone and 1,3-butanediol, N-methylpyrrolidone and ethylene glycol monohexyl ether, N-methylpyrrolidone and diethylene glycol monoethyl ether, N,N-dimethylacetamide and 2,3-butanediol and ethylene glycol monoethyl ether acetate, N,N-dimethylacetamide and 2,3-butanediol and cyclohexanol, N,N-dimethylacetamide and 2,3-butanediol and diethylene glycol dimethyl ether, N,N-dimethylacetamide and 2,3-butanediol and n-hexylacetate, N,N-dimethylacetamide and cyclohexanol and diethylene glycol dimethyl ether, N,N-dimethylacetamide and cyclohexanol and n-hexylacetate, N,N-dimethylacetamide and cyclohexanol and ethylene glycol monoethyl ether acetate, N,N-dimethylacetamide and diethylene glycol dimethyl ether and n-hexylacetate, N,N-dimethylacetamide and diethylene glycol dimethyl ether and ethylene glycol monoethyl ether acetate, N,N-dimethylacetamide and n-hexylacetate and ethylene glycol monoethyl ether acetate, 1,3-dimethyl-2-imidazolidinone and diethylene glycol monoethyl ether acetate and 2-phenoxyethanol, 1,3-dimethyl-2-imidazolidinone and diethylene glycol monobutyl ether and diethylene glycol monoethyl ether acetate, 1,3-dimethyl-2-imidazolidinone and diethylene glycol monobutyl ether and triethylene glycol dimethyl ether, 1,3-dimethyl-2-imidazolidinone and diethylene glycol monobutyl ether and 2-phenoxyethanol, 1,3-dimethyl-2-imidazolidinone and diethylene glycol monobutyl ether and 1,3-butanediol, 1,3-dimethyl-2-imidazolidinone and diethylene glycol monobutyl ether and tripropylene glycol monomethyl ether, 1,3-dimethyl-2-imidazolidinone and diethylene glycol monobutyl ether and ethylene glycol monohexyl ether, 1,3-dimethyl-2-imidazolidinone and diethylene glycol monoethyl ether acetate and triethylene glycol dimethyl ether, 1,3-dimethyl-2-imidazolidinone and diethylene glycol monoethyl ether acetate and 1,3-butanediol, 1,3-dimethyl-2-imidazolidinone and diethylene glycol monoethyl ether acetate and tripropylene glycol monomethyl ether, 1,3-dimethyl-2-imidazolidinone and diethylene glycol monoethyl ether acetate and ethylene glycol monohexyl ether, 1,3-dimethyl-2-imidazolidinone and triethylene glycol dimethyl ether and 2-phenoxyethanol, 1,3-dimethyl-2-imidazolidinone and triethylene glycol dimethyl ether and 1,3-butanediol, 1,3-dimethyl-2-imidazolidinone and triethylene glycol dimethyl ether and tripropylene glycol monomethyl ether, 1,3-dimethyl-2-imidazolidinone and triethylene glycol dimethyl ether and ethylene glycol monohexyl ether, 1,3-dimethyl-2-imidazolidinone and 2-phenoxyethanol and 1,3-butanediol, 1,3-dimethyl-2-imidazolidinone and 2-phenoxyethanol and tripropylene glycol monomethyl ether, 1,3-dimethyl-2-imidazolidinone and 2-phenoxyethanol and ethylene glycol monohexyl ether, 1,3-dimethyl-2-imidazolidinone and 1,3-butanediol and tripropylene glycol monomethyl ether, 1,3-dimethyl-2-imidazolidinone and 1,3-butanediol and ethylene glycol monohexyl ether, 1,3-dimethyl-2-imidazolidinone and tripropylene glycol monomethyl ether and ethylene glycol monohexyl ether, N-methylpyrrolidone and diethylene glycol monoethyl ether acetate and diethylene glycol diethyl ether, N-methylpyrrolidone and diethylene glycol monoethyl ether acetate and triethylene glycol dimethyl ether, N-methylpyrrolidone and diethylene glycol monoethyl ether acetate and 1,3-butanediol, N-methylpyrrolidone and diethylene glycol monoethyl ether acetate and ethylene glycol monohexyl ether, N-methylpyrrolidone and diethylene glycol monoethyl ether acetate and diethylene glycol monoethyl ether, N-methylpyrrolidone and diethylene glycol diethyl ether and triethylene glycol dimethyl ether, N-methylpyrrolidone and diethylene glycol diethyl ether and 1,3-butanediol, N-methylpyrrolidone and diethylene glycol diethyl ether and ethylene glycol monohexyl ether, N-methylpyrrolidone and diethylene glycol diethyl ether and diethylene glycol monoethyl ether, N-methylpyrrolidone and triethylene glycol dimethyl ether and 1,3-butanediol, N-methylpyrrolidone and triethylene glycol dimethyl ether and ethylene glycol monohexyl ether, N-methylpyrrolidone and triethylene glycol dimethyl ether and diethylene glycol monoethyl ether, N-methylpyrrolidone and 1,3-butanediol and ethylene glycol monohexyl ether, N-methylpyrrolidone and 1,3-butanediol and diethylene glycol monoethyl ether, or N-methylpyrrolidone and ethylene glycol monohexyl ether and diethylene glycol monoethyl ether.

5. The method according to claim 1, wherein the charge-transporting substance is an oligoaniline derivative of formula (1) or a quinonediimine derivative which is an oxidized form of formula (1)

 (1)

wherein $R^1$, $R^2$ and $R^3$ are each independently a hydrogen atom, a halogen atom, a hydroxyl group, an amino group, a silanol group, a thiol group, a carboxyl group, a phosphate group, a phosphate ester group, an ester group, a thioester group, an amido group, a nitro group, a monovalent hydrocarbon group, an organooxy group, an organoamino group, an organosilyl group, an organothio group, an acyl group or a sulfonic acid group; A and B are each independently a divalent group of formula (2) or (3) below

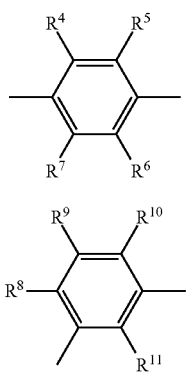

$R^4$ to $R^{11}$ being each independently a hydrogen atom, a halogen atom, a hydroxyl group, an amino group, a silanol group, a thiol group, a carboxyl group, a phosphate group, a phosphate ester group, an ester group, a thioester group, an amido group, a nitro group, a monovalent hydrocarbon group, an organooxy group, an organoamino group, an organosilyl group, an organothio group, an acyl group or a sulfonic acid group; and m and n are each independently an integer of 1 or more, and together satisfy the condition $m+n \leq 20$.

6. A method of controlling a thickness variation of a charge-transporting thin-film produced using a charge-transporting varnish that includes a charge-transporting substance made of a charge-transporting monomer or a charge-transporting oligomer having a number-average molecular weight of from 200 to 5,000 and having no molecular weight distribution, or a charge-transporting material made of the charge-transporting substance and a charge-accepting dopant substance; and a solvent, which method is characterized by using as the solvent a mixed solvent containing at least one good solvent and at least one bad solvent, and setting the boiling point difference ΔT (° C.) between the good solvent and the poor solvent to an absolute value that satisfies the condition |ΔT|<20° C., setting the viscosity at 25° C. of the charge-transporting varnish to 7.5 mPa·s or less, and setting the surface tension at 23° C. of the charge-transporting varnish to from 30.0 to 40.0 mN/m, wherein said thickness variation is not more than ±3 nm when a thin-film with a thickness of 30 nm is formed by slit coating.

7. The method according to claim 1, wherein the charge-transporting oligomer has a number-average molecular weight of from 200 to 2,000.

8. The method according to claim 1, wherein the charge-transporting oligomer has a number-average molecular weight of from 200 to 1,000.

* * * * *